US008895400B2

(12) United States Patent
Seo et al.

(10) Patent No.: US 8,895,400 B2
(45) Date of Patent: Nov. 25, 2014

(54) METHODS OF FABRICATING SEMICONDUCTOR DEVICES HAVING BURIED WORD LINE INTERCONNECTS

(75) Inventors: Hyeoung-Won Seo, Gyeonggi-do (KR); Yun-Gi Kim, Gyeonggi-do (KR); Young-Woong Son, Gyeonggi-do (KR); Bong-Soo Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 61 days.

(21) Appl. No.: 13/473,751

(22) Filed: May 17, 2012

(65) Prior Publication Data

US 2012/0264280 A1 Oct. 18, 2012

Related U.S. Application Data

(62) Division of application No. 11/842,416, filed on Aug. 21, 2007, now abandoned.

(30) Foreign Application Priority Data

Aug. 24, 2006 (KR) .................................. 2006-80700

(51) Int. Cl.
*H01L 21/331* (2006.01)
*H01L 27/108* (2006.01)
*H01L 21/74* (2006.01)
*H01L 21/311* (2006.01)

(52) U.S. Cl.
CPC .... *H01L 27/10891* (2013.01); *H01L 27/10894* (2013.01); *H01L 27/10876* (2013.01); *H01L 21/743* (2013.01); *H01L 27/10823* (2013.01); *H01L 27/10897* (2013.01)
USPC ............. 438/361; 438/42; 438/430; 438/689; 438/700; 257/E21.659; 257/E21.537; 257/E21.538; 257/E21.683; 257/E21.585; 257/E29.17; 257/E21.613; 257/E21.66; 257/E21.862

(58) Field of Classification Search
CPC ..... H01L 27/105; H01L 27/108; H01L 27/11; H01L 27/112; H01L 21/82339; H01L 27/10876; H01L 27/10891; H01L 27/10894; H01L 27/10897; H01L 21/743
USPC .................. 257/225, 296, 300, 390, E27.084, 257/E27.098, E27.102, E21.646, E21.66, 257/E21.678, E21.683, E21.691, E21.661, 257/E21.662, E21.659, E21.537, E21.538, 257/E21.585, E21.862, E21.68, E29.17, 257/E21.613; 438/689, 700, 361, 430, 42
See application file for complete search history.

(56) References Cited

U.S. PATENT DOCUMENTS

| 4,443,868 A | 4/1984 | Takemae | 365/205 |
| 5,736,761 A | 4/1998 | Risch et al. | 257/301 |

(Continued)

FOREIGN PATENT DOCUMENTS

| JP | 2002-373988 | 12/2002 |
| KR | 10-1999-005921 A | 1/1999 |

(Continued)

OTHER PUBLICATIONS

Decision to Grant Patent for Korean Application No. 10-2006-0080700; Oct. 25, 2007.

*Primary Examiner* — Galina Yushina
(74) *Attorney, Agent, or Firm* — Myers Bigel Sibley & Sajovec, P.A.

(57) ABSTRACT

A semiconductor device includes a semiconductor substrate having a cell region and a peripheral circuit region defined therein. A buried word line is disposed in the substrate in the cell region and has a top surface lower than top surfaces of cell active regions in the cell region. A gate line is disposed on the substrate in the peripheral circuit region. A word line interconnect is disposed in the substrate in the peripheral circuit region, the word line interconnect including a first portion contacting the buried word line and having a top surface lower than a top surfaces of the cell active regions and a second portion that is overlapped by and in contact with the gate line.

20 Claims, 24 Drawing Sheets

(56) References Cited

U.S. PATENT DOCUMENTS

| | | | |
|---|---|---|---|
| 6,323,518 B1 * | 11/2001 | Sakamoto et al. | 257/330 |
| 6,465,298 B2 | 10/2002 | Forbes et al. | |
| 6,657,255 B2 | 12/2003 | Hshieh et al. | |
| 6,689,660 B1 | 2/2004 | Noble et al. | 438/268 |
| 6,754,131 B2 * | 6/2004 | Kirsch et al. | 365/230.06 |
| 6,770,535 B2 | 8/2004 | Yamada et al. | |
| 7,034,408 B1 | 4/2006 | Schloesser | 257/213 |
| 2001/0025973 A1 | 10/2001 | Yamada et al. | 257/296 |
| 2001/0053577 A1 | 12/2001 | Forbes et al. | 438/242 |
| 2003/0011032 A1 * | 1/2003 | Umebayashi | 257/368 |
| 2005/0048714 A1 | 3/2005 | Noble | 438/243 |
| 2005/0255661 A1 | 11/2005 | Katsumata | 438/314 |
| 2006/0046398 A1 | 3/2006 | McDaniel et al. | 438/279 |
| 2006/0128070 A1 | 6/2006 | Park et al. | 438/128 |
| 2006/0214209 A1 | 9/2006 | Doyle | 257/296 |
| 2006/0244024 A1 | 11/2006 | Manger et al. | 257/296 |
| 2006/0270159 A1 | 11/2006 | Weis | 438/266 |
| 2006/0291321 A1 | 12/2006 | Leung | 365/230.06 |
| 2007/0105334 A1 * | 5/2007 | Jang et al. | 438/396 |
| 2007/0215920 A1 | 9/2007 | Zundel et al. | 257/288 |

FOREIGN PATENT DOCUMENTS

| | | |
|---|---|---|
| KR | 1020030002816 A | 1/2003 |
| KR | 1020050089294 A | 9/2005 |

* cited by examiner

METHODS OF FABRICATING SEMICONDUCTOR DEVICES HAVING BURIED WORD LINE INTERCONNECTS

REFERENCE TO PRIORITY APPLICATIONS

This application is a divisional of U.S. patent application Ser. No. 11/842,416, filed Aug. 21, 2007 now abandoned, which claims priority to Korean Patent Application No. 2006-0080700, filed Aug. 24, 2006, the contents of which are hereby incorporated herein by reference in their entirety.

FIELD

The present invention relates to semiconductor devices, and more particularly, to semiconductor devices having buried word lines and methods of fabricating the same.

BACKGROUND

Integrated circuits include discrete devices, such as transistors, and interconnects for electrically connecting the discrete devices to each other. A typical transistor has a source region, a drain region and a gate electrode, which are disposed on a semiconductor substrate. The source and drain regions are spaced apart from each other in an active region of the semiconductor substrate. The gate electrode is disposed between the source region and the drain region and insulated from the active region.

Recently, as semiconductor devices have become more highly integrated, techniques have been developed that involve burying a gate electrode in a gate trench crossing the active region. A memory device, such as a dynamic random access memory (DRAM), typically has a plurality of cell transistors disposed in a cell array region and p-channel metal oxide semiconductor (pMOS) transistors and n-channel metal oxide semiconductor (nMOS) transistors disposed in a peripheral circuit region. The cell transistors are disposed at predetermined intervals in the cell array region. Gate electrodes of the cell transistors are connected to a word line.

A conventional technique for forming a buried word line involves burying the word line at a lower level than a top surface of the active region. For example, a semiconductor device having a buried word line is disclosed in U.S. Pat. No. 6,770,535 B2 entitled to "Semiconductor Integrated Circuit Device and Process for Manufacturing the Same" by Yamada et al.

Planar transistors such as high-voltage transistors may be disposed in the peripheral circuit region. Gate electrodes of the planar transistors may be disposed at a higher level than the active region. In addition, a plurality of gate lines may be formed at the same level as the gate electrodes.

However, the buried word line typically must be electrically connected to a gate line of the peripheral circuit region corresponding thereto. A technique for electrically connecting the buried word line with the gate line using a bypass interconnect and a contact plug has been developed. According to the technique using a bypass interconnect and a contact plug, a first interlayer insulating layer covering the buried word line and the gate line is formed, the bypass interconnect is disposed on the first interlayer insulating layer, and the contact plug penetrating the first interlayer insulating layer is used.

Other interconnects crossing between the buried word line and the gate line may be disposed on the first interlayer insulating layer. In order to electrically connect the buried word line with the gate line, a second interlayer insulating layer is formed on the first interlayer insulating layer, the bypass interconnect is disposed on the second interlayer insulating layer, and a contact plug penetrating the first and second interlayer insulating layers is used. The contact plug may be difficult to form, and a signal transmission path may be lengthened. Consequently, a technique using a bypass interconnect and a contact plug may not provide an advantageous structure for high integration, and may degrade electrical characteristics and reliability.

SUMMARY

In some embodiments of the present invention, a semiconductor device includes a semiconductor substrate having a cell region and a peripheral circuit region defined therein. A buried word line is disposed in the substrate in the cell region and has a top surface lower than top surfaces of cell active regions in the cell region. A gate line is disposed on the substrate in the peripheral circuit region. A unitary word line interconnect is disposed in the substrate in the peripheral circuit region, the word line interconnect including a first portion contacting the buried word line and having a top surface lower than a top surfaces of the cell active regions and a second portion that is overlapped by and in contact with the gate line.

The second portion of the word line interconnect may extend vertically from the first portion of the word line interconnect to contact a bottom surface of the gate line. The first portion of the word line interconnect may be laterally offset with respect to the buried word line. The top surface of the first portion of the word line interconnect may be at substantially the same level at the top surface of the buried word line and the first portion of the word line interconnect may have substantially the same cross-sectional area as the buried word line. An insulating pattern may be disposed on the first portion of the word line interconnect and the buried word line. A bottom surface of the insulating pattern may be lower than the top surfaces of the cell active regions. A bit line may be disposed on the insulating pattern and may cross the buried word line.

In further embodiments, the semiconductor device may further include second and third spaced-apart gate lines on the substrate in the peripheral circuit region on respective sides of the bit line. A buried peripheral circuit interconnect may be disposed in the substrate in the peripheral circuit region beneath the bit line, and may connect the first and second gate lines and have a portion beneath the bit line that has a top surface at substantially the same level as the top surface of the buried word line.

Further embodiments of the present invention provide methods of fabricating a semiconductor device. An isolation region is formed in a semiconductor substrate, defining cell active regions in a cell region and peripheral circuit active regions in a peripheral circuit region. A word line trench is formed in the substrate in the cell region and an adjoining word line interconnect trench is formed in the peripheral circuit region. A word line pattern is formed in the word line trench and a word line interconnect pattern is formed in the word line interconnect trench. A gate line is formed on the substrate in the peripheral circuit region, the gate line having an end portion that overlaps the word line interconnect pattern. The word line pattern and the word line interconnect pattern are etched back to form a word line in the word line trench having a top surface lower than a top surface of the cell active regions and a word line interconnect in the word line interconnect trench having a first portion connected to the word line and a top surface lower than the top surfaces of the cell active regions and a second portion extending vertically from the first portion to contact a bottom surface of the gate line. An insulating pattern is formed on the buried word line and the first portion of the word line interconnect.

In some embodiments, forming a word line trench includes forming a first sacrificial mask pattern on the substrate having the isolation layer, forming sacrificial spacers on sidewalls of the first sacrificial mask pattern, forming a second sacrificial mask pattern filling a gap between the sacrificial spacers, removing the sacrificial spacers and etching the isolation layer and the semiconductor substrate using the first and second sacrificial mask patterns as etching masks to form the word line trench and the word line interconnect trench. Forming a first sacrificial mask pattern on the substrate may be preceded by forming a peripheral circuit gate dielectric layer on the peripheral circuit active regions, forming a peripheral circuit gate conductive layer on the peripheral circuit gate dielectric layer and forming a sacrificial oxide layer on the peripheral circuit gate conductive layer. In some embodiments, forming a gate line includes etching the first and second sacrificial mask patterns and the sacrificial oxide layer to expose the peripheral circuit gate conductive layer, forming a metal layer covering the peripheral circuit gate conductive layer, the word line pattern, and the word line interconnect pattern and patterning the metal layer and the peripheral circuit gate conductive layer to form the gate line. The word line pattern and the word line interconnect pattern may be formed from a common metal layer.

In further embodiments, a bit line is formed on the insulating pattern and crossing the buried word line. A peripheral circuit interconnect trench may be formed in the substrate in the peripheral circuit region concurrent with forming the word line trench in the substrate in the cell region and the adjoining word line interconnect trench in the peripheral circuit region. A peripheral circuit interconnect pattern may be formed in the peripheral circuit interconnect trench concurrent with forming the word line pattern in the word line trench and the word line interconnect pattern in the word line interconnect trench. Second and third spaced apart gate lines may be formed in the peripheral circuit region on respective sides of the bit line concurrent with forming the first gate line on the substrate in the peripheral circuit region, the first and second gate lines overlapping and contacting the peripheral circuit interconnect pattern. The peripheral circuit interconnect pattern may be etched back concurrent with etching back the word line pattern and the word line interconnect pattern to form a peripheral circuit interconnect having a first portion with a top surface that is lower than a top surface of the peripheral circuit active regions and second portions that extend vertically from the first portion to contact bottom surfaces of respective ones of the second and third gate lines. An insulating pattern may be formed on the first portion of the peripheral circuit interconnect concurrent with forming the insulating pattern on the buried word line and the first portion of the word line interconnect.

Some embodiments of the invention provides semiconductor devices including interconnects that may be advantageous to high integration and may have excellent electrical characteristics.

Other embodiments of the invention provide methods of fabricating a semiconductor device including interconnects that may be advantageous to high integration and may have excellent electrical characteristics.

In some embodiments, the present invention provides semiconductor devices having buried interconnects. A device has an isolation layer disposed on a semiconductor substrate. By the isolation layer, cell active regions are defined in a cell region, and peripheral circuit active regions are defined in a peripheral circuit region. A buried word line is disposed in the cell region. The buried word line is disposed at a lower level than the top surface of the cell active region. A buried interconnect is disposed in the peripheral circuit region. The buried interconnect is disposed at a lower level than the top surface of the peripheral circuit active regions. Gate lines are disposed at a higher level than the buried interconnect. The gate lines have regions overlapping the buried interconnect. In the overlapping regions, the buried interconnect contacts the gate lines.

In some embodiments of the present invention, the buried interconnect may project toward the gate lines in the overlapping region.

In other embodiments, the gate line may project toward the buried interconnect in the overlapping region.

In still other embodiments, the buried interconnect may be disposed at the same level as the buried word line. In addition, the buried interconnect may have the same cross-sectional area as the buried word line. Furthermore, the buried interconnect may be the same material layer as the buried word line. In this case, the buried interconnect and the buried word line may have a metal layer. The metal layer may be a titanium nitride (TiN) layer.

In yet other embodiments, the buried interconnect and the buried word line may be in contact with each other.

In yet other embodiments, the buried interconnect may have two overlapping regions spaced apart from each other. One of the gate lines passing through an n-channel metal oxide semiconductor (nMOS) region may contact one part of the buried interconnect in one of the overlapping regions. The other one of the gate lines passing through a p-channel metal oxide semiconductor (pMOS) region may contact the other part of the buried interconnect in the other of the overlapping regions.

In yet other embodiments, the gate lines may be disposed at a higher level than the peripheral circuit active regions.

In yet other embodiments, an insulating pattern may be disposed on the buried interconnect and buried word line. The bottom surface of the insulating pattern may be disposed at a lower level than the top surfaces of the adjacent active regions.

In yet other embodiments, a bit line crossing the buried interconnect may be disposed on the insulating pattern.

In other embodiments, the present invention provides methods of fabricating semiconductor devices. A method may include: providing a semiconductor substrate having a cell region and a peripheral circuit region; forming an isolation layer defining cell active regions in the cell region and peripheral circuit active regions in the peripheral circuit region; etching the cell active regions and the isolation layer, and simultaneously forming word line trenches in the cell region and interconnect trenches in the peripheral circuit region; simultaneously forming word lines in the word line trenches and interconnect patterns in the interconnect trenches; forming gate lines on the semiconductor substrate having the interconnect patterns, the gate lines having regions overlapping the interconnect patterns; etching-back the word lines and the interconnect patterns and forming buried word lines and buried interconnects, the buried interconnects contacting the gate lines in the overlapping regions; and forming an insulating pattern on the buried word lines and the buried interconnects.

In some embodiments of the present invention, forming the word line trenches and the interconnect trenches may include: forming a first sacrificial mask pattern on the substrate having the isolation layer; forming sacrificial spacers on sidewalls of the first sacrificial mask pattern; forming a second sacrificial mask pattern filling a gap between the sacrificial spacers; removing the sacrificial spacers; and etching the isolation layer and the cell active layers using the first and second sacrificial mask patterns as etching masks. The first and second mask patterns may be formed of a material layer having an etch selectivity with respect to the active regions and the isolation layer. The sacrificial spacers may be formed of a polysilicon layer. The word line trenches and the interconnect trenches may be formed to have a smaller width than the resolution limit of a photolithography process.

In other embodiments, before the first sacrificial mask pattern is formed, a peripheral circuit gate dielectric layer may be formed on the peripheral circuit active regions. A peripheral circuit gate conductive layer may be formed on the semiconductor substrate having the peripheral circuit gate dielectric layer. A sacrificial oxide layer may be formed on the peripheral circuit gate conductive layer.

In still other embodiments, forming the gate lines may include: while the word lines and the interconnect patterns are formed, etching the sacrificial mask patterns and the sacrificial oxide layer and exposing the peripheral circuit gate conductive layer; forming a metal layer covering the peripheral circuit gate conductive layer, the word lines, and the interconnect patterns; and continuously patterning the metal layer and the peripheral circuit gate conductive layer.

In yet other embodiments, the word lines and the interconnect patterns may be formed of a metal layer.

In yet other embodiments, the word line trenches may be formed to be connected to the interconnect trenches corresponding thereto, respectively.

In yet other embodiments, the bottom surface of the insulating pattern may be formed at a lower level than the top surfaces of the adjacent active regions.

In yet other embodiments, a bit line disposed on the insulating pattern and crossing the buried interconnects may be formed.

In additional embodiments, the present invention provides additional methods of fabricating a semiconductor device. A method may include: providing a semiconductor substrate having a cell region and a peripheral circuit region; forming an isolation layer defining cell active regions in the cell region and peripheral circuit active regions in the peripheral circuit region; etching the cell active regions and the isolation layer, and simultaneously forming word line trenches in the cell region and interconnect trenches in the peripheral circuit region; simultaneously forming buried word lines in the word line trenches and buried interconnects in the interconnect trenches; forming gate lines on the semiconductor substrate having the buried interconnects, the gate lines having regions overlapping the buried interconnects, the buried interconnects contacting the gate lines in the overlapping regions; and forming an insulating pattern on the buried word lines and the buried interconnects disposed at a lower level than top surfaces of the adjacent active regions.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF THE INVENTION

Figure 1:
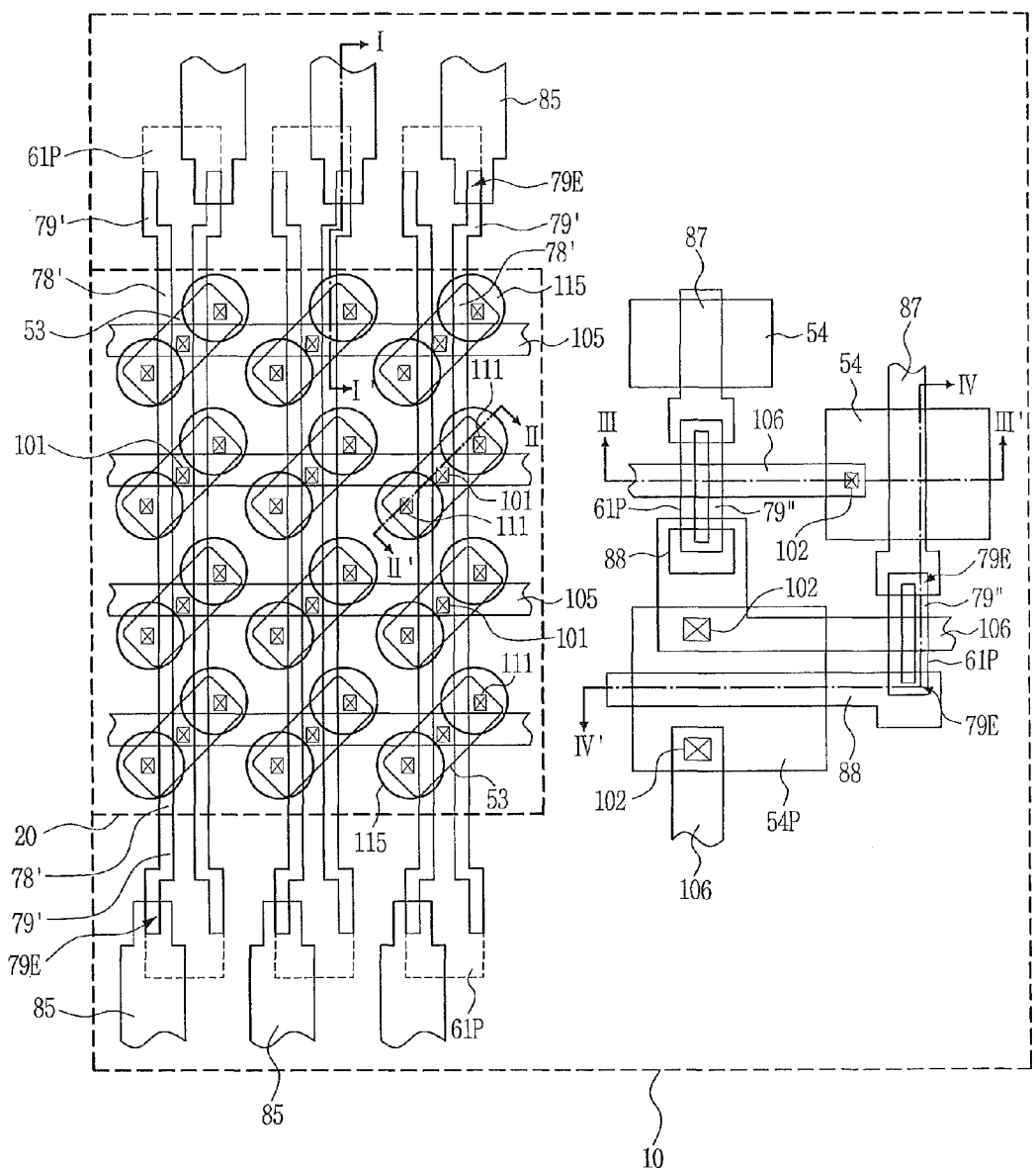
FIG. 1 is a plan view of a semiconductor device having buried interconnects according to first exemplary embodiments of the present invention.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Semiconductor devices and methods of fabricating the same according to first exemplary embodiments of the present invention will now be described with reference to FIGS. 1 to 14. FIG. 1 is a plan view of a semiconductor device. FIGS. 2 to 14 are composites of cross-sectional views illustrating methods of fabricating the semiconductor device of FIG. 1, in which a cross-section 1 is taken along line I-I' of FIG. 1, a cross-section 2 is taken along line II-II' of FIG. 1, a cross-section 3 is taken along line III-III' of FIG. 1, and a cross-section 4 is taken along line IV-IV' of FIG. 1.

Figure 2:
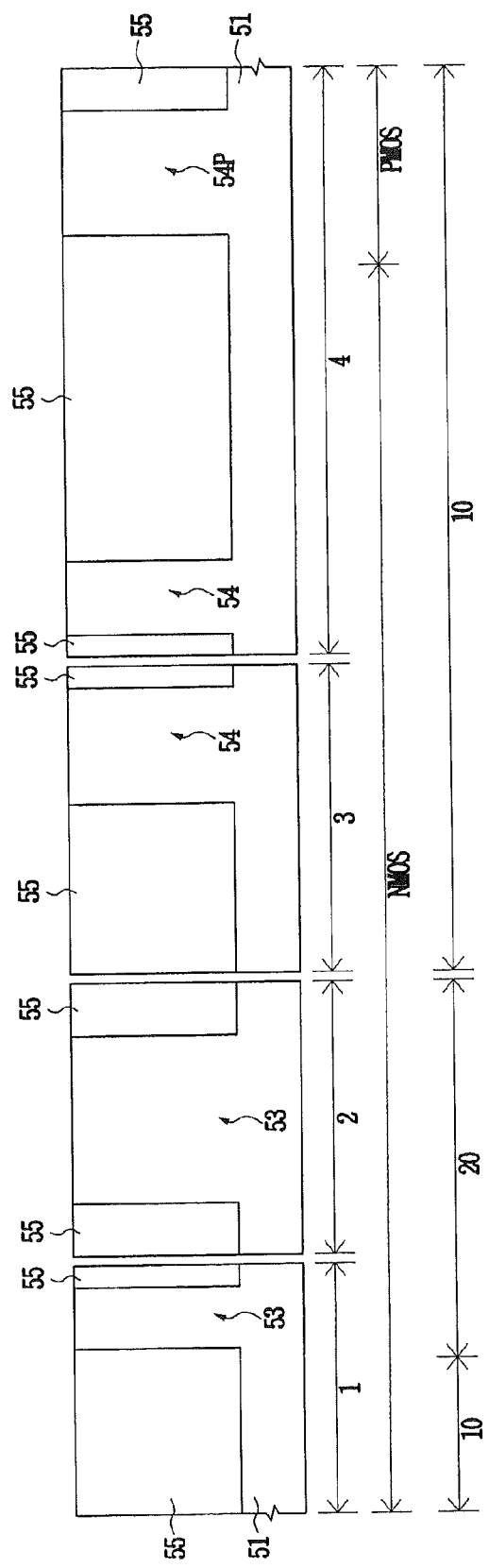
FIGS. 2 through 14 are composites of cross-sectional views illustrating operations for forming the semiconductor device of FIG. 1.

Referring to FIGS. 1 and 2, an isolation layer 55 defining active regions 53, 54 and 54P may be formed on a semiconductor substrate 51. The isolation layer 55 may be formed by a trench isolation technique. The isolation layer 55 may be formed of an insulating layer, such as a silicon oxide layer.

The semiconductor substrate 51 may be a silicon wafer having a peripheral circuit region 10 and a cell region 20. The active regions 53, 54 and 54P may include cell active regions 53, n-channel metal oxide semiconductor (nMOS) peripheral circuit active regions 54, and a p-channel metal oxide semiconductor (pMOS) peripheral circuit active regions 54P. In the cell region 20, the cell active regions 53 may be arranged at predetermined intervals in row and column directions. The nMOS peripheral circuit active regions 54 and the pMOS peripheral circuit active regions 54P may be disposed in the peripheral circuit region 10.

Subsequently, a process of implanting well ions into the active regions 53, 54 and 54P may be performed. The well-ion implantation process may include a process of implanting p-type impurity ions and a process of implanting n-type impurity ions.

For example, the process of implanting p-type impurity ions into the cell active regions 53 and the nMOS peripheral circuit active regions 54 may be performed, and also, the process of implanting n-type impurity ions into the pMOS peripheral circuit active regions 54P may be performed. In this case, nMOS transistors may be formed in the cell active regions 53 and the nMOS peripheral circuit active regions 54, and pMOS transistors may be formed in the pMOS peripheral circuit active regions 54P.

Figure 3:
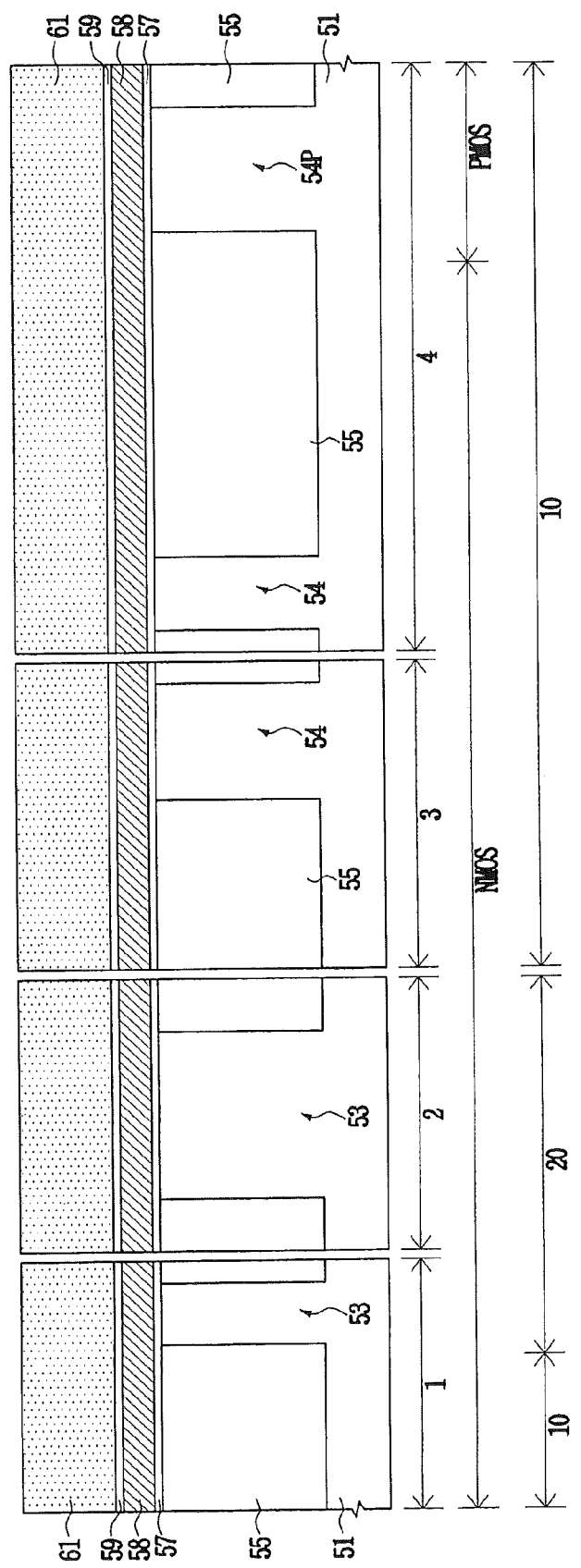

Referring to FIGS. 1 and 3, a peripheral circuit gate dielectric layer 57 may be formed on the active regions 53, 54 and 54P. A peripheral circuit gate conductive layer 58, a sacrificial oxide layer 59, and a first sacrificial mask layer 61 may be sequentially stacked on the semiconductor substrate 51 having the peripheral circuit gate dielectric layer 57.

The peripheral circuit gate dielectric layer 57 may be a silicon oxide layer, a high-k dielectric layer, or a combination thereof. The peripheral circuit gate dielectric layer 57 may be formed to cover the surfaces of the active regions 53, 54 and 54P.

The peripheral circuit gate conductive layer 58 may be a conductive layer, such as an undoped polysilicon layer. The peripheral circuit gate conductive layer 58 may cover the top surface of the semiconductor substrate 51 having the peripheral circuit gate dielectric layer 57.

The sacrificial oxide layer 59 may be a silicon oxide layer, such as a thermal oxide layer. The sacrificial oxide layer 59 may cover the top surface of the peripheral circuit gate conductive layer 58.

The first sacrificial mask layer 61 may be a material layer having an etch selectivity with respect to the peripheral circuit gate conductive layer 58, the active regions 53, 54 and 54P, and the isolation layer 55. The first sacrificial mask layer 61 may be a nitride layer such as a silicon nitride layer.

Figure 4:
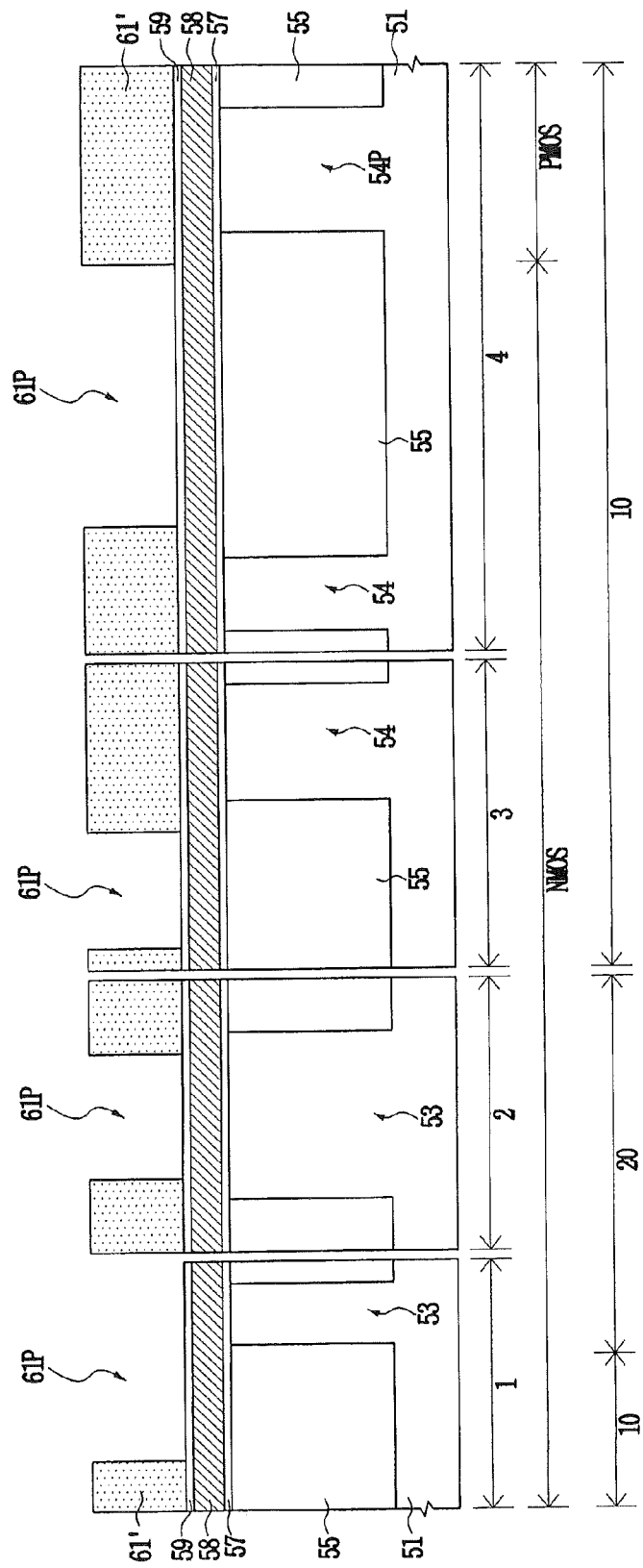

Referring to FIGS. 1 and 4, the first sacrificial mask layer 61 is patterned to form a first sacrificial mask pattern 61' having first openings 61P. The sacrificial oxide layer 59 may be exposed at the bottom of the first openings 61P.

The first openings 61P may be formed in a groove shape in a column direction in the cell region 20. Also, the first openings 61P may be formed parallel to each other. In addition, the first openings 61P may be formed to cross over the cell active regions 53. Furthermore, the first openings 61P may extend from the cell region 20 to the peripheral circuit region 10.

The first openings 61P may be formed in the peripheral circuit region 10 as well. In this case, the first openings 61P may be formed on the isolation layer 55.

Figure 5:
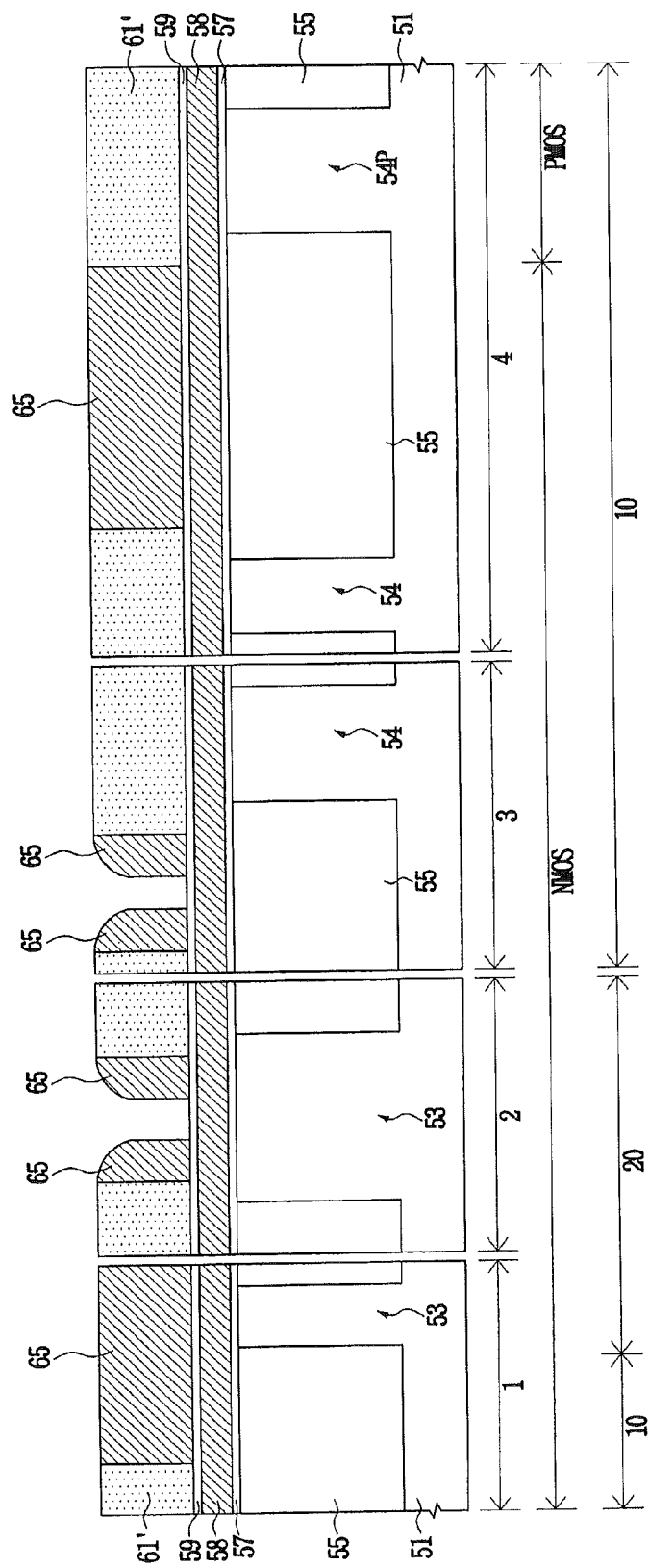

Referring to FIGS. 1 and 5, sacrificial spacers 65 may be formed on sidewalls of the first sacrificial mask pattern 61'. The sacrificial spacers 65 may be formed from a material layer having an etch selectivity with respect to the first sacrificial mask pattern 61'. The sacrificial spacers 65 may be polysilicon.

For example, a polysilicon layer covering inner walls of the first openings 61P and the top surface of the first sacrificial mask pattern 61' may be formed. The polysilicon layer may be anisotropically etched, so that the sacrificial oxide layer 59 may be exposed. In this case, the polysilicon layer may remain on the sidewalls of the first openings 61P. Here, the thickness of the sacrificial spacers 65 can be adjusted by controlling deposition conditions of the polysilicon layer. The sacrificial spacers 65 may have a smaller thickness than the resolution limit of a photolithography process. Alternatively, the anisotropic etching process may be omitted.

Figure 6:
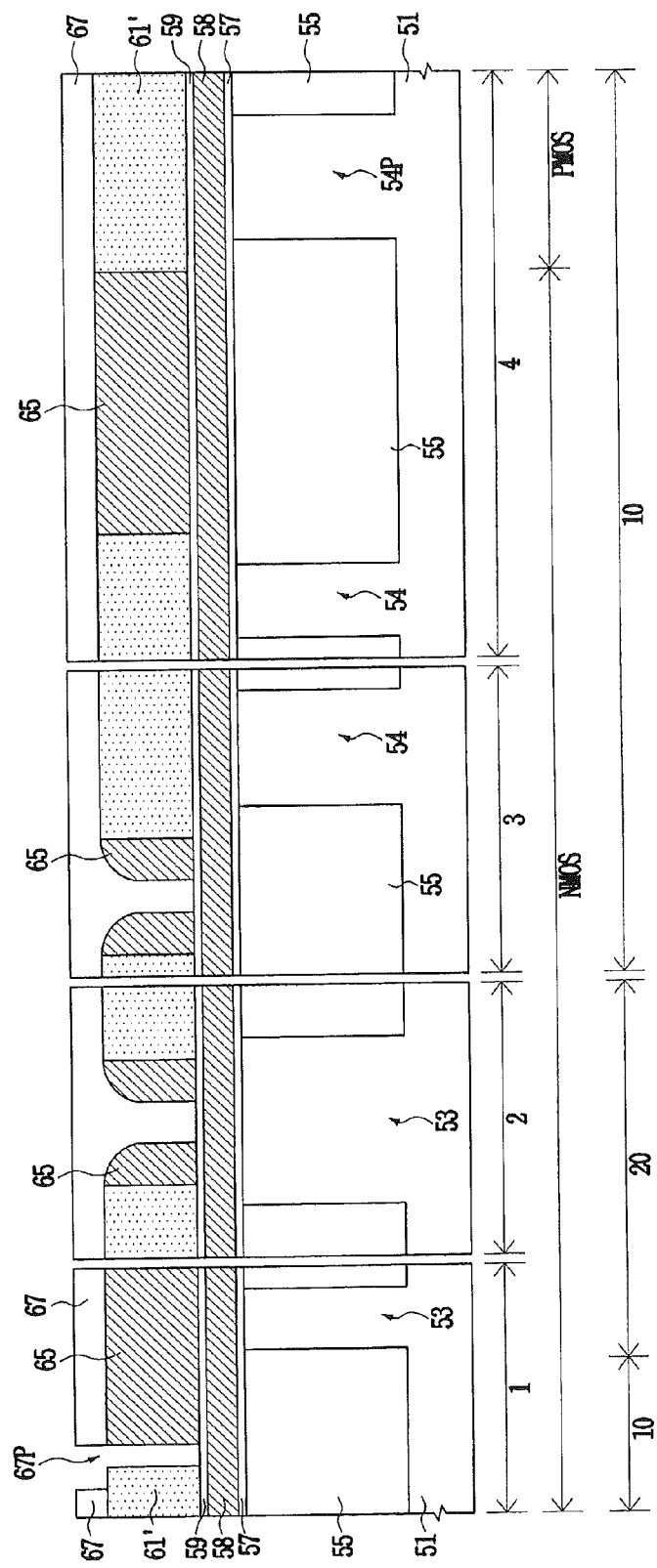

Referring to FIGS. 1 and 6, a patterning process for separating a sacrificial spacer 65 may be performed. Specifically, a photoresist pattern 67 may be formed on the semiconductor substrate 51 having the sacrificial spacers 65. One of the sacrificial spacers 65 is partially etched using the photoresist pattern 67 as an etching mask, so that a second opening 67P exposing the sacrificial oxide layer 59 may be formed. The second opening 67P may be selectively formed at both ends of a first one of the openings 61P. For example, the second opening 67P may be formed to overlap both ends of the first openings 61P extending from the cell region 20 to the peripheral circuit region 10. Subsequently, the photoresist pattern 67 may be removed.

Figure 7:
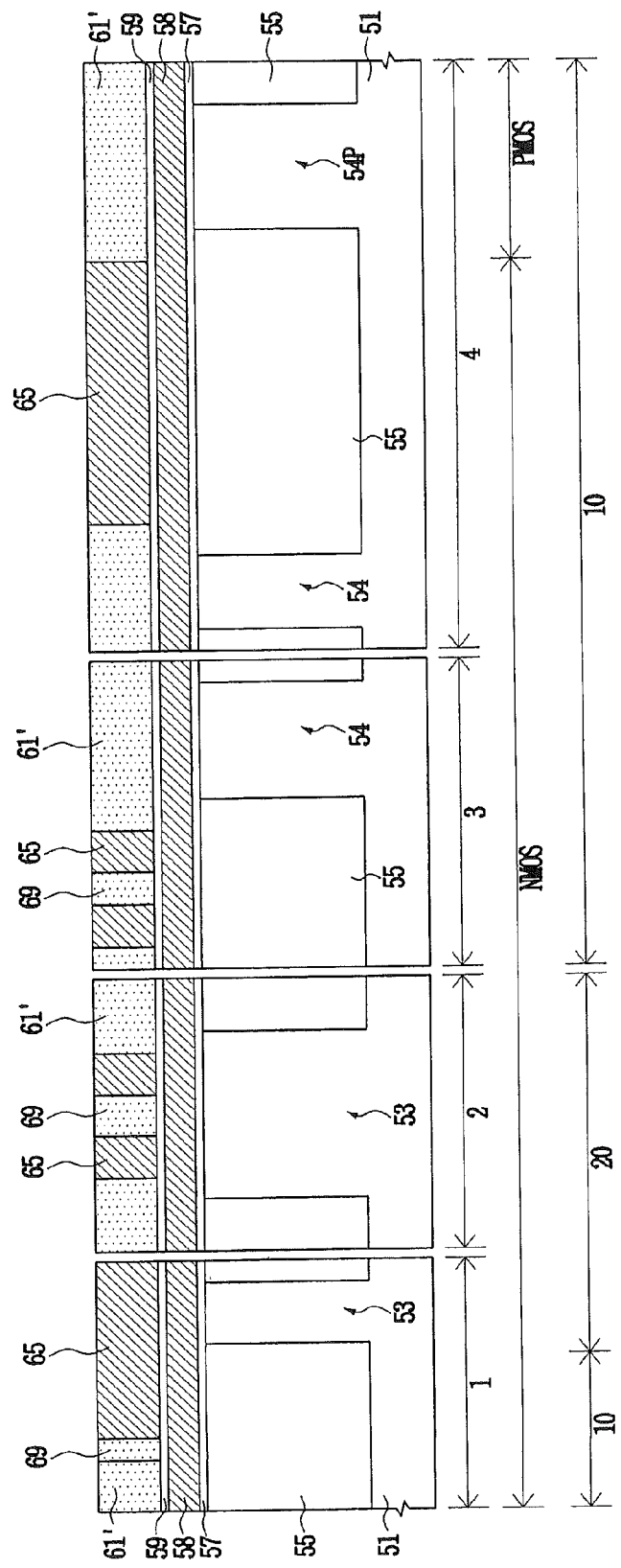

Referring to FIGS. 1 and 7, a second sacrificial mask pattern 69 filling a gap between the sacrificial spacers 65 and the first and second openings 61P and 67P may be formed.

Specifically, a second sacrificial mask layer filling the first openings 61P and the second openings 67P and covering the semiconductor substrate 51 may be formed. The second sacrificial mask layer is planarized until the sacrificial spacer 65 is exposed, so that the second sacrificial mask pattern 69 may be formed. A chemical-mechanical, polishing (CMP) process or etch back process may be used for planarization of the second sacrificial mask layer.

Figure 8:
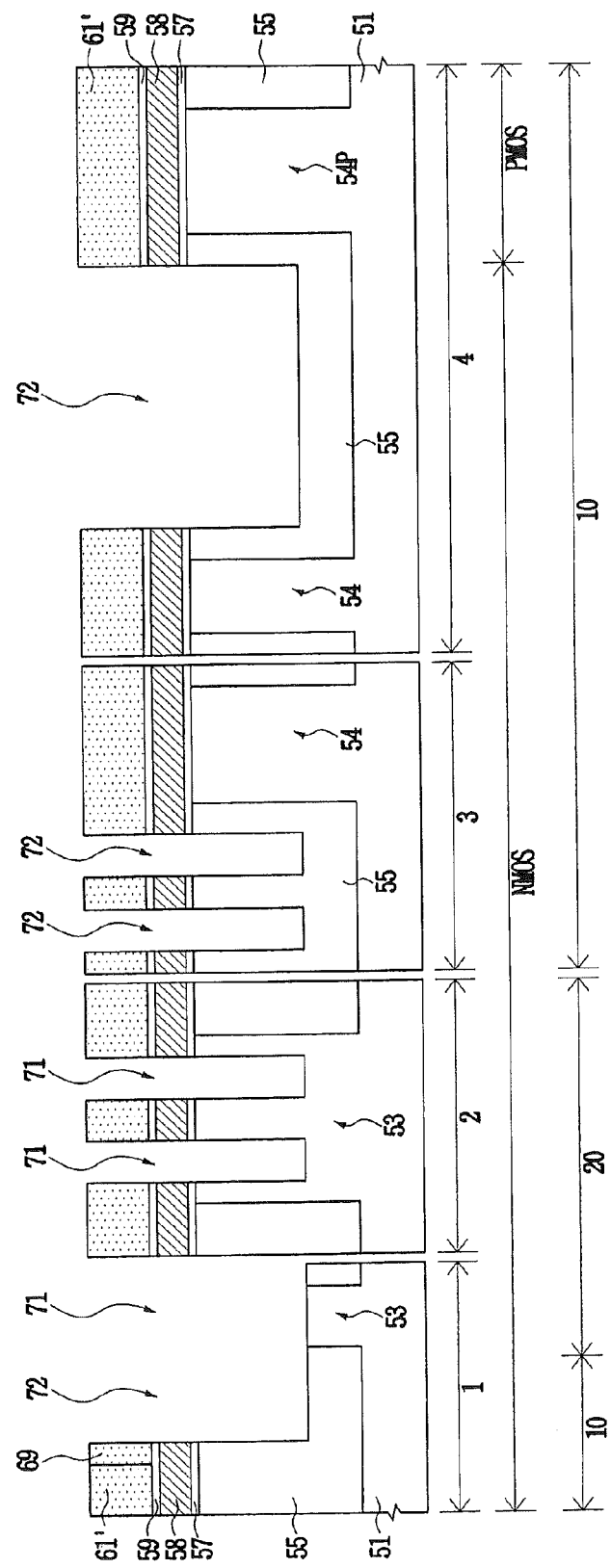

Referring to FIGS. 1 and 8, the sacrificial spacers 65 may be removed. An isotropic etching having an etch selectivity between the sacrificial mask patterns 61' and 69 and the sacrificial spacers 65 may be used to remove the sacrificial spacers 65. In other words, the isotropic etching may have a high etch rate with respect to the sacrificial spacers 65. Consequently, the sacrificial mask patterns 61' and 69 may remain on the semiconductor substrate 51.

Using the sacrificial mask patterns 61' and 69 as etching masks, the sacrificial oxide layer 59, the peripheral circuit gate conductive layer 58, the peripheral circuit gate dielectric layer 57, the isolation layer 55, and the cell active regions 53 are anisotropically etched, so that word line trenches 71 and interconnect trenches 72 may be formed. The word line trenches 71 may be formed in the cell region 20, and the interconnect trenches 72 may be formed in the peripheral circuit region 10. The word line trenches 71 may be connected to the interconnect trenches 72 corresponding thereto, respectively. In other words, the word line trenches 71 may extend to be connected to the interconnect trenches 72.

Sizes of the word line trenches 71 and the interconnect trenches 72 may be determined by the sacrificial spacer 65. When the sacrificial spacer 65 has a smaller width than the resolution limit of a photolithography process, the word line trenches 71 and the interconnect trenches 72 may also be formed to have a width smaller than the resolution limit of a photolithography process.

Figure 9:
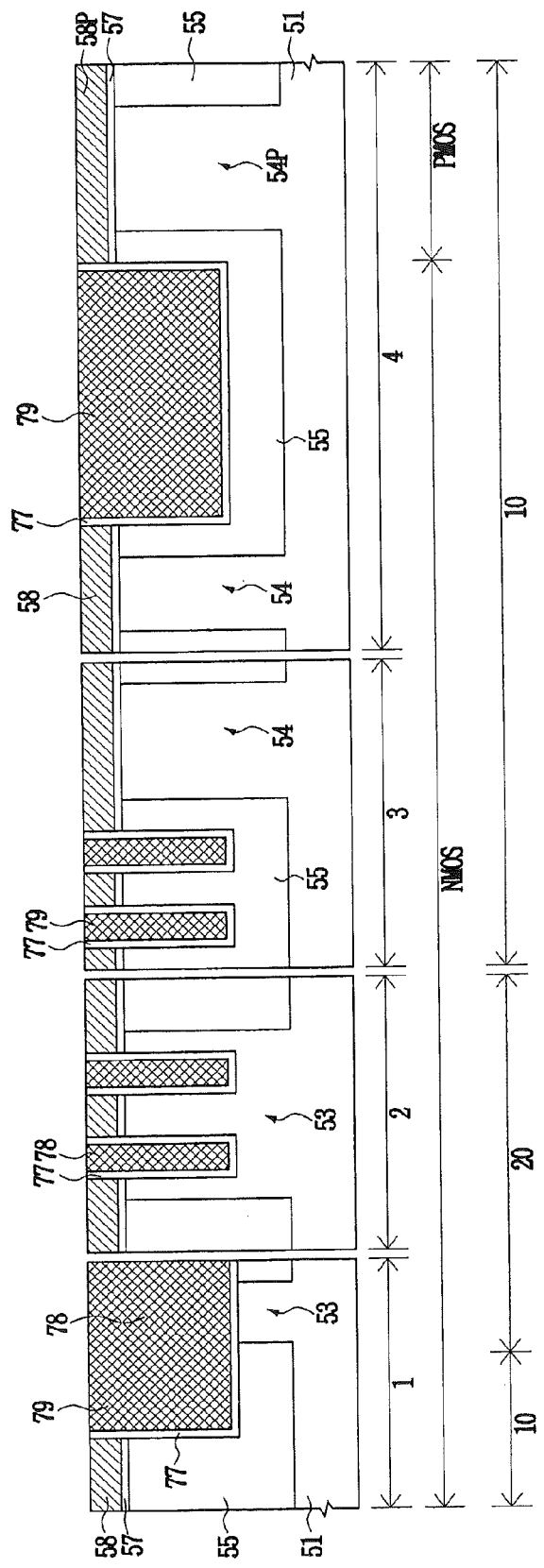

Referring to FIGS. 1 and 9, the sacrificial mask patterns 61' and 69 may be removed. An isotropic etching process may be used to remove the sacrificial mask patterns 61' and 69. A cell gate dielectric layer 77 may be formed on inner walls of the word line trenches 71. The cell gate dielectric layer 77 may be formed of a silicon oxide layer, a high-k dielectric layer, or a combination thereof. The cell gate dielectric layer 77 may be formed to uniformly cover surfaces of the cell active regions 53 exposed to the word line trenches 71.

On the semiconductor substrate 51 having the cell gate dielectric layer 77, a word conductive layer may be formed. The word conductive layer is planarized, so that word lines 78 may be formed in the word line trenches 71, and simultaneously, interconnect patterns 79 may be formed in the interconnect trenches 72. A CMP process or etch back process may be used for planarization of the word conductive layer. Subsequently, the sacrificial oxide layer 59 is removed, so that the peripheral circuit gate conductive layer 58 may be exposed.

The word lines 78 and the interconnect patterns 79 may be formed of a metal-containing layer, such as a titanium nitride (TiN) layer. The peripheral circuit gate conductive layer 58, the word lines 78, and the interconnect patterns 79 may be exposed on substantially the same plane. In addition, the word lines 78 and the interconnect patterns 79 may be formed at a lower level than the top surface of the peripheral circuit gate conductive layer 58. Furthermore, the word lines 78 may contact the interconnect patterns 79 corresponding thereto, respectively.

The sacrificial mask patterns 61' and 69 may be removed after the word lines 78 and the interconnect patterns 79 are formed.

Impurity ions may be implanted into the peripheral circuit gate conductive layer 58. For example, n-type impurity ions may be implanted into the peripheral circuit gate conductive layer 58 in an nMOS region, and p-type impurity ions may be implanted into a peripheral circuit gate conductive layer 58P in a pMOS region.

Figure 10:
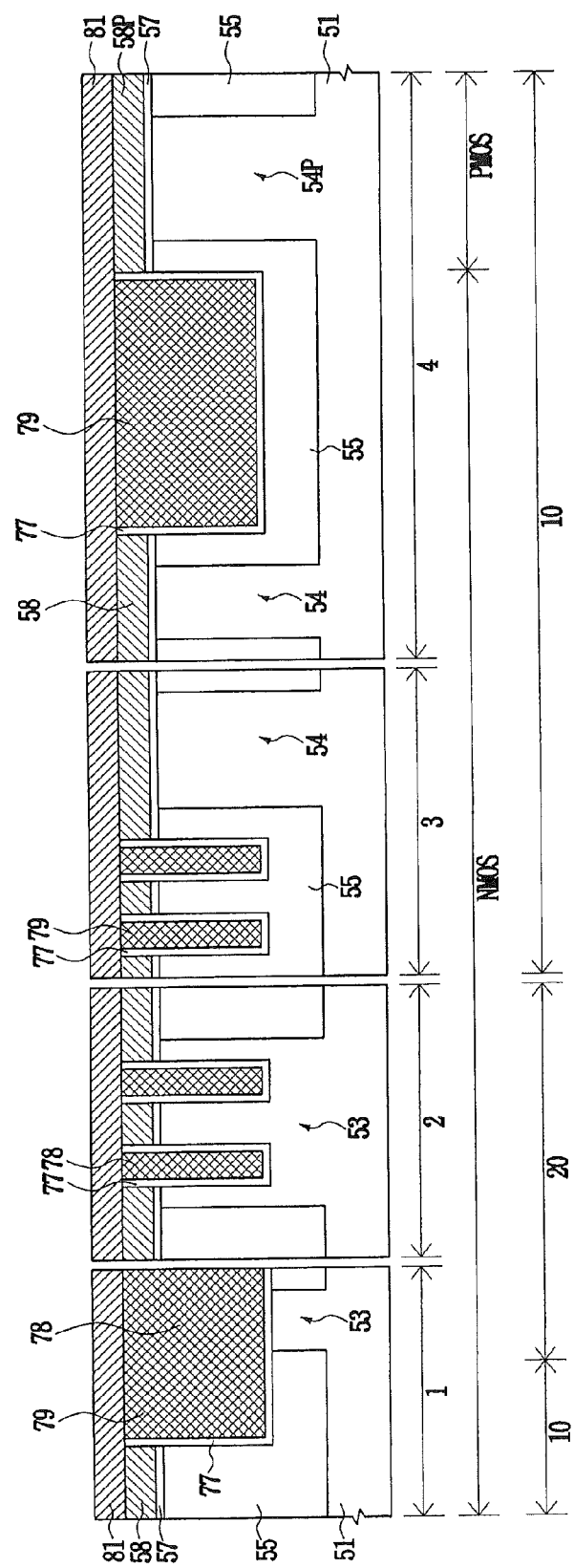

Referring to FIGS. 1 and 10, an upper conductive layer 81 covering the peripheral circuit gate conductive layers 58 and 58P, the word lines 78, and the interconnect patterns 79 may be formed. The upper conductive layer 81 may be formed of a metal layer such as tungsten (W) or tungsten silicide (WSi). The upper conductive layer 81 may contact the peripheral circuit gate conductive layers 58 and 58P, the word lines 78, and the interconnect patterns 79.

Figure 11:
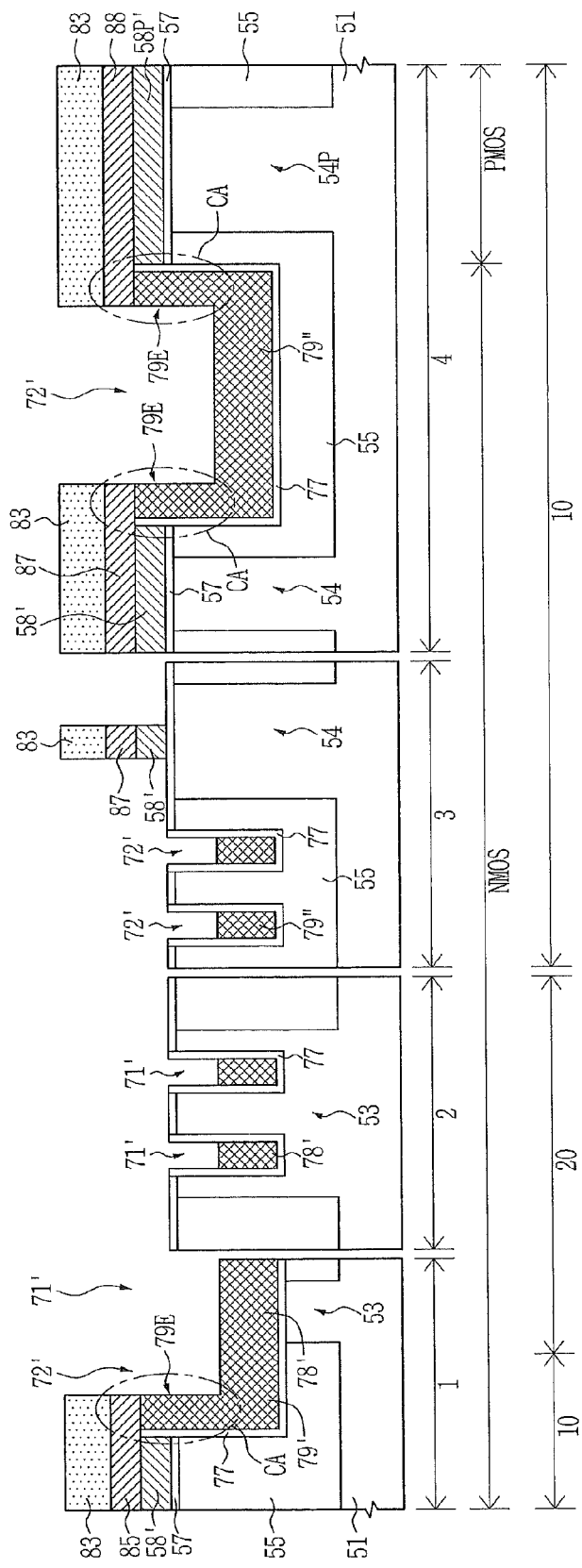

Referring to FIGS. 1 and 11, a hard mask pattern 83 may be formed on the upper conductive layer 81. The hard mask pattern 83 may be formed of a nitride layer, such as a silicon nitride layer.

The upper conductive layer 81 and the peripheral circuit gate conductive layers 58 and 58P are etched back using the hard mask pattern 83 as an etching mask, so that gate lines 85, 87 and 88 may be formed. The gate lines 85, 87 and 88 may include first gate lines 85, second gate lines 87, and third gate lines 88. Under the gate lines 85, 87 and 88, patterned peripheral circuit gate conductive layers 58' and 58P' may remain. In addition, the gate lines 85, 87 and 88 may have regions CA overlapping the interconnect patterns 79.

As the result, parts of the interconnect patterns 79, except for the overlapped regions CA, and the word lines 78 may be exposed. The exposed interconnect patterns 79 and the word lines 78 are etched back, so that buried word line interconnects 79' and buried word lines 78' may be formed.

In contrast with conventional contacts using contact plugs to contact buried word lines, the word line interconnects 79' have a unitary structure including a first portion at the same level as the buried word lines 78' and a second portion 79E that extends vertically from the first portion to contact the gate lines 85, 87 and 88 in the overlapping regions CA. The buried word lines 78' and first portions of the buried interconnects 79' have top surfaces lower than the top surfaces of the adjacent active regions 53, 54 and 54P. In some embodiments, the word line interconnect may be formed from a common conductive layer with the buried word line, such that some embodiments may be viewed as providing a direct or plugless connection of a buried word line to a gate line.

Upper word line trenches 71' may be formed on the buried word lines 78', and upper interconnect trenches 72' may be formed on the buried interconnects 79'.

The buried word lines 78' may contact respective ones of the buried interconnects 79'. In this case, the buried interconnects 79' may be in contact with one of the first gate lines 85. The buried word lines 78' may be electrically connected with the first gate lines 85.

The second gate lines 87 may be formed to cross over the nMOS peripheral circuit active regions 54. The peripheral circuit gate dielectric layer 57 and the patterned peripheral circuit gate conductive layers 58' sequentially stacked between the nMOS peripheral circuit active regions 54 and the second gate lines 87 may be conserved.

The third gate lines 88 may be formed to cross over the pMOS peripheral circuit active regions 54P. The peripheral circuit gate dielectric layer 57 and the patterned peripheral circuit gate conductive layers 58P' sequentially stacked between the pMOS peripheral circuit active regions 54P and the third gate lines 88 may be conserved.

The buried interconnects 79' may be formed between the second gate lines 87 and the third gate lines 88. In this case, one end of the buried interconnects 79' may overlap the second gate lines 87, and the other end thereof may overlap the third gate lines 88. Respective ends of the buried interconnects 79' may project toward the second and third gate lines 87 and 88, respectively.

Figure 12:
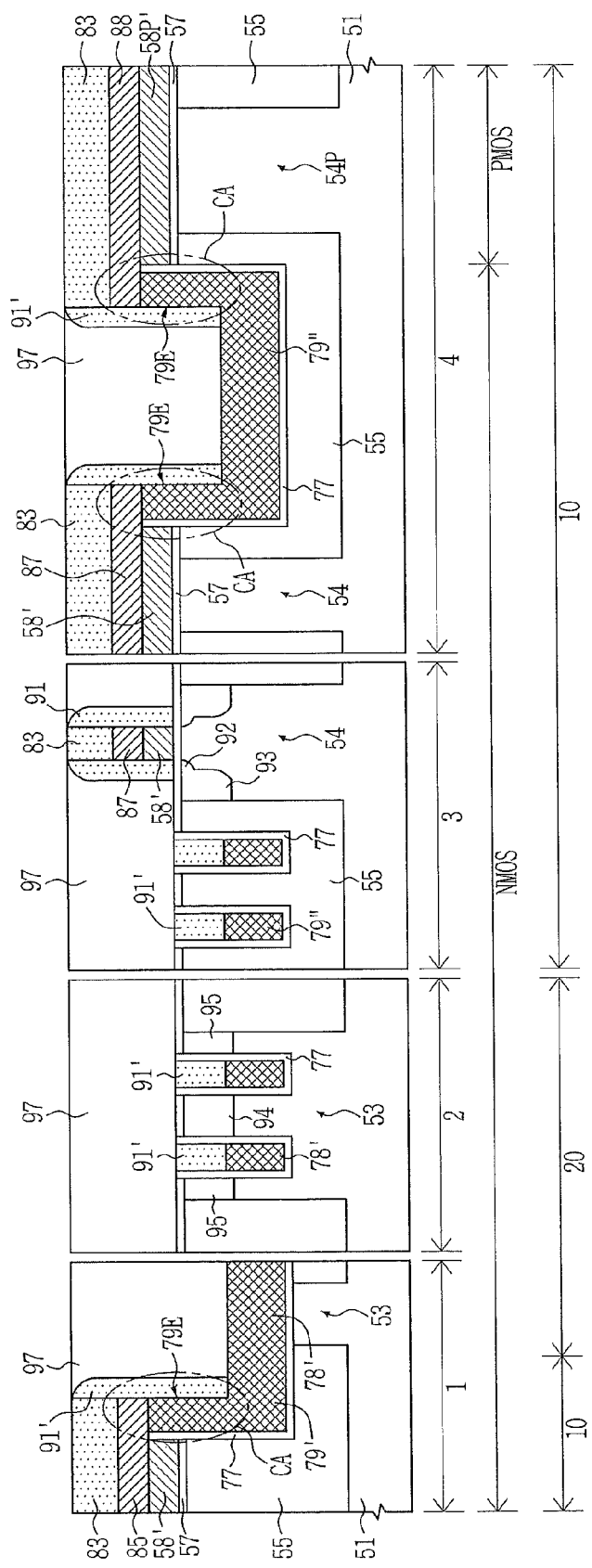

Referring to FIGS. 1 and 12, low-concentration impurity regions 92 may be formed in the nMOS peripheral circuit active regions 54 on respective sides of the second gate lines 87. Spacers 91 may be formed on sidewalls of the patterned peripheral circuit gate conductive layers 58' and the gate lines 85, 87 and 88. The spacers 91 may be formed of a silicon oxide layer, a silicon nitride layer, or a combination thereof. Source and drain regions 93, 94 and 95 may be formed in the active regions 53, 54 and 54P.

Subsequently, a first interlayer insulating layer 97 may be formed on the semiconductor substrate 51. The first interlayer insulating layer 97 may be formed of a silicon oxide layer. The first interlayer insulating layer 97 is planarized, so that the hard mask pattern 83 may be exposed. A CMP process or etch back process may be used for planarization of the first interlayer insulating layer 97.

While the spacers 91 and the first interlayer insulating layer 97 are formed, an insulating pattern 91' may be formed on the buried word lines 78' and the buried interconnects 79'. More specifically, while the spacers 91 are formed, the insulating pattern 91' may be formed in the upper word line trenches 71' and the upper interconnect trenches 72'. Alternatively, the upper word line trenches 71' and the upper interconnect trenches 72' may be filled by the first interlayer insulating layer 97.

Figure 13:
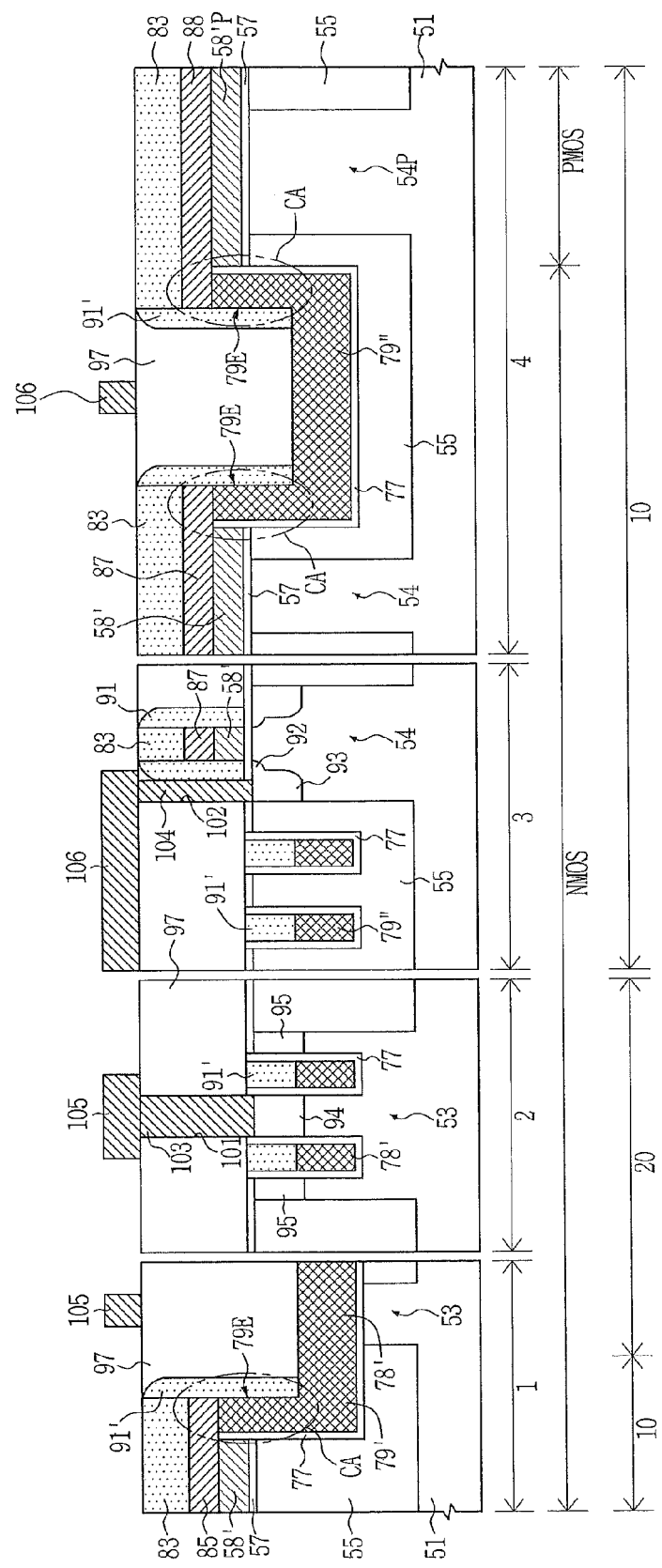

Referring to FIGS. 1 and 13, the first interlayer insulating layer 97 is patterned, so that bit contact holes 101 and 102 exposing the source and drain regions 93 and 94 may be formed. Bit plugs 103 and 104 filling the bit contact holes 101 and 102 may be formed. Bit lines 105 and 106 contacting the bit plugs 103 and 104 may be formed on the first interlayer insulating layer 97. The bit lines 105 and 106 and the bit plugs 103 and 104 may be formed of a metal layer, a polysilicon layer, or a combination thereof.

The bit lines 105 and 106 may include first bit lines 105 formed in the cell region 20 and second bit lines 106 formed in the peripheral circuit region 10.

Figure 14:
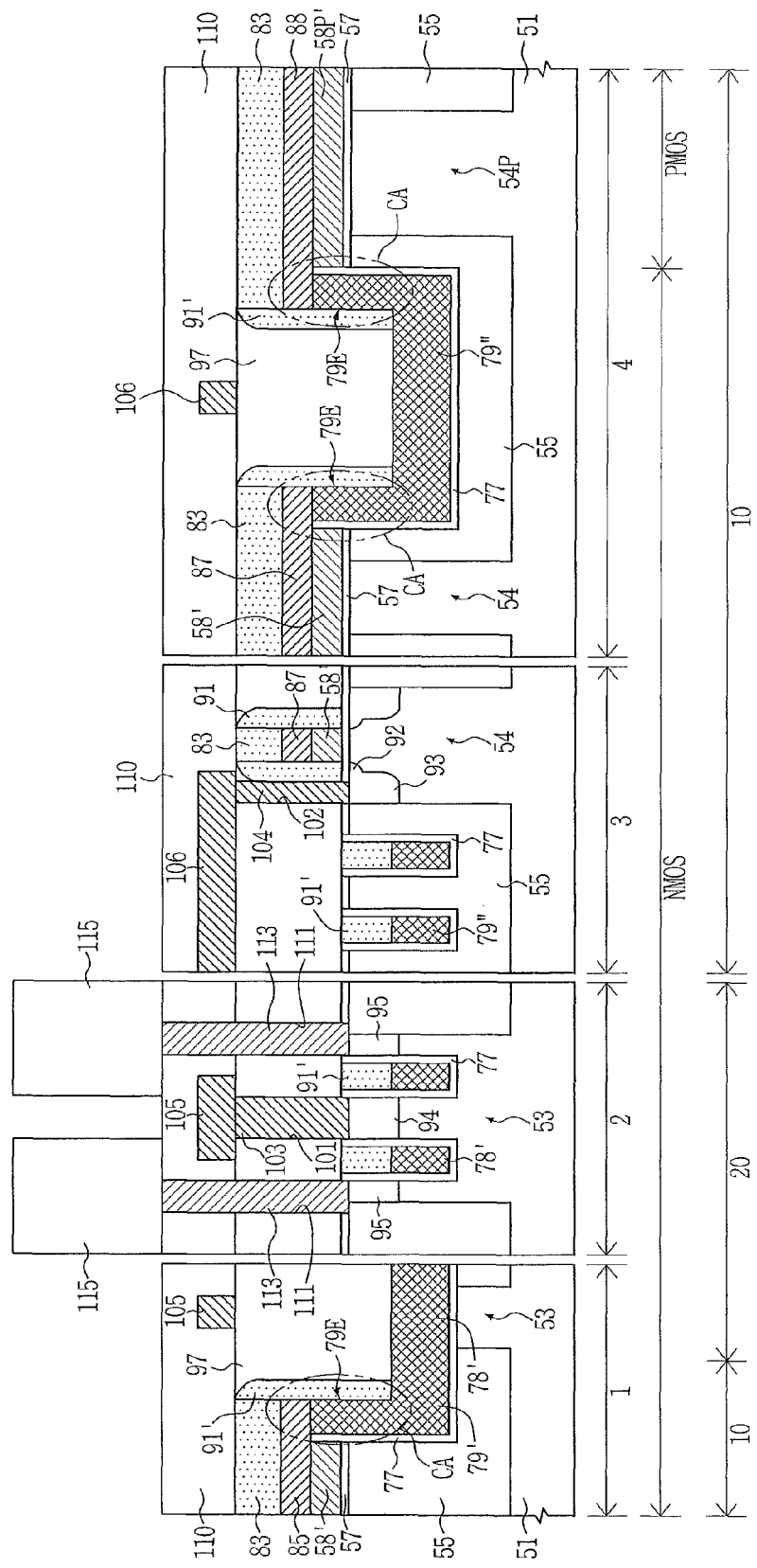

Referring to FIGS. 1 and 14, a second interlayer insulating layer 110 may be formed on the semiconductor substrate 51 having the bit lines 105 and 106. The second interlayer insulating layer 110 may be a silicon oxide layer. Node contact holes 111 penetrating the second interlayer insulating layer 110 and the first interlayer insulating layer 97 and exposing the source and drain regions 95 may be formed. Node plugs 113 filling the node contact holes 111 may be formed. Storage nodes 115 contacting the node plugs 113 may be formed on the second interlayer insulating layer 110. The storage nodes 115 and the node plugs 113 may be a metal layer, a polysilicon layer, or a combination thereof.

Now, referring to FIGS. 1 and 14, a semiconductor device according to first exemplary embodiments of the present invention will be described. The device may have an isolation layer 55 disposed on a semiconductor substrate 51. The semiconductor substrate 51 may be a silicon wafer having a peripheral circuit region 10 and a cell region 20.

By the isolation layer 55, cell active regions 53 may be defined in the cell region 20, and peripheral circuit active regions 54 and 54P may be defined in the peripheral circuit region 10. The cell active regions 53 may be arranged at predetermined intervals in row and column directions in the cell region 20. The peripheral circuit active regions 54 and 54P may include nMOS peripheral circuit active regions 54 and pMOS peripheral circuit active regions 54P. The isolation layer 55 may be an insulating layer such as a silicon oxide layer.

Buried word lines 78' may be disposed in the cell region 20. The buried word lines 78' may be disposed at a lower level than the top surface of the cell active regions 53. Buried interconnects 79' may be disposed in the peripheral circuit region 10. The buried interconnects 79' may be disposed at a lower level than the top surface of the peripheral circuit active regions 54 and 54p.

Bottoms and sidewalls of the buried interconnects 79' and the buried word lines 78' may be surrounded by a cell gate dielectric layer 77. Thus, the cell gate dielectric layer 77 may be interposed between the buried word lines 78' and the cell active regions 53. The cell gate dielectric layer 77 may be a silicon oxide layer, a high-k dielectric layer, or a combination thereof.

The buried interconnects 79' may be disposed at the same level as the buried word lines 78'. In other words, bottom surfaces of the buried interconnects 79' and the buried word lines 78' may be disposed on the same plane. In addition, the buried interconnects 79' may have the same cross-sectional area as the buried word lines 78'. The buried interconnects 79' and the buried word lines 78' may have a smaller width than the resolution limit of a photolithography process. Furthermore, the buried interconnects 79' may be the same material layer as the buried word lines 78'. In this case, the buried interconnects 79' and the buried word lines 78' may have a metal-containing layer. The metal-containing layer may be a titanium nitride (TiN) layer.

The gate lines 85, 87 and 88 may be disposed at a higher level than the buried interconnects 79'. A hard mask pattern 83 may be provided on the gate lines 85, 87 and 88. The hard mask pattern 83 may be a nitride layer such as a silicon nitride layer. The gate lines 85, 87 and 88 may include first gate lines 85, second gate lines 87, and third gate lines 88. The gate lines 85, 87 and 88 may be a metal layer such as a tungsten (W) layer or a tungsten silicide (WSi) layer. The gate lines 85, 87 and 88 may be disposed at a higher level than the peripheral circuit active regions 54 and 54P.

The gate lines 85, 87 and 88 may have overlapping regions CA overlapping the buried interconnects 79'. In the overlapping regions CA, the buried interconnects 79' may contact the gate lines 85, 87 and 88. The buried interconnects 79' may project toward the gate lines 85, 87 and 88 in the overlapping regions CA. In other words, the buried interconnects 79' may have projections 79E projecting upward.

The buried word lines 78' may contact the buried interconnects 79' corresponding thereto, respectively. In this case, the buried interconnects 79' may be in contact with one of the first gate lines 85. In other words, the overlapping regions CA may be provided between the buried interconnects 79' and the first gate lines 85. In the overlapping regions CA, the buried interconnects 79' may have the projections 79E projecting toward the first gate lines 85. Consequently, the buried word lines 78' may be electrically connected with the first gate lines 85.

The second gate lines 87 may be disposed to cross over the nMOS peripheral circuit active regions 54. The third gate lines 88 may be disposed to cross over the pMOS peripheral circuit active regions 54P. The buried interconnects 79' may be disposed between the second gate lines 87 and the third gate lines 88. In this case, one end of the buried interconnects 79' may overlap the second gate lines 87, and the other end thereof may overlap the third gate lines 88. In other words, the projections 79E projecting toward the second and third gate lines 87 and 88 may be provided at the both ends of the buried interconnects 79'.

A peripheral circuit gate dielectric layer 57 and patterned peripheral circuit gate conductive layers 58' may be sequentially stacked between the nMOS peripheral circuit active regions 54 and the second gate lines 87. The peripheral circuit gate dielectric layer 57 may be a silicon oxide layer, a high-k dielectric layer, or a combination thereof. The patterned peripheral circuit gate conductive layers 58' may be a polysilicon layer.

Between the pMOS peripheral circuit active regions 54P and the third gate line 88, the peripheral circuit gate dielectric layer 57 and the patterned peripheral circuit gate conductive layers 58P' may be sequentially stacked. Also, between the isolation layer 55 and the gate lines 85, 87 and 88, the peripheral circuit gate dielectric layer 57 and the patterned peripheral circuit gate conductive layers 58' and 58P' may be sequentially stacked.

Spacers 91 may be disposed on sidewalls of the patterned peripheral circuit gate conductive layers 58' and the second gate lines 87. The spacers 91 may be a silicon oxide layer, a silicon nitride layer, a silicon oxynitride layer, or a combination thereof.

Low-concentration impurity regions 92 may be disposed in the nMOS peripheral circuit active regions 54 under the spacers 91. Source and drain regions 93, 94 and 95 may be disposed in the active regions 53, 54 and 54P adjacent to both sides of the buried word lines 78' and the gate lines 87 and 88.

An insulating pattern 91' may be disposed on the buried interconnects 79' and the buried word lines 78'. The bottom surface of the insulating pattern 91' may be disposed at a lower level than the top surfaces of the adjacent active regions 53, 54 and 54P. The insulating pattern 91' may be a silicon oxide layer, a silicon nitride layer, a silicon oxynitride layer, or a combination thereof.

A first interlayer insulating layer 97 may be provided on the semiconductor substrate 51 having the insulating pattern 91'. The first interlayer insulating layer 97 may be an insulating layer such as a silicon oxide layer.

Bit lines 105 and 106 may be disposed on the first interlayer insulating layer 97. The bit lines 105 and 106 may cross over the buried interconnects 79' and the buried word lines 78'. The bit lines 105 and 106 may include first bit lines 105 disposed in the cell region 20 and second bit lines 106 disposed in the peripheral circuit region 10. The bit lines 105 and 106 may be connected to the source and drain regions 93 and 94 through bit plugs 103 and 104 penetrating the first interlayer insulating layer 97. The bit lines 105 and 106 and the bit plugs 103 and 104 may be a metal layer, a polysilicon layer, or a combination thereof.

The semiconductor substrate 51 having the bit lines 105 and 106 may be covered by a second interlayer insulating layer 110. The second interlayer insulating layer 110 may be an insulating layer, such as a silicon oxide layer. Storage nodes 115 may be disposed on the second interlayer insulating layer 110. The storage nodes 115 may be connected to the source and drain regions 95 through node plugs 113 sequentially penetrating the second interlayer insulating layer 110 and the first interlayer insulating layer 97. The storage nodes 115 and the node plugs 113 may be a metal layer, a polysilicon layer, or a combination thereof.

As described above, according to the first embodiments of the present invention, the buried interconnects 79' may be disposed at a lower level than the top surfaces of the active regions 53, 54 and 54P. Thus, arrangement of the bit lines 105 and 106 disposed on the insulating pattern 91' is not disturbed. In addition, a signal transmission path can be shortened in comparison with a conventional bypass interconnect method using a bit line layer or a metal interconnect layer. Consequently, a semiconductor device having excellent electrical characteristics and advantageous to high integration can be embodied.

Figure 15:
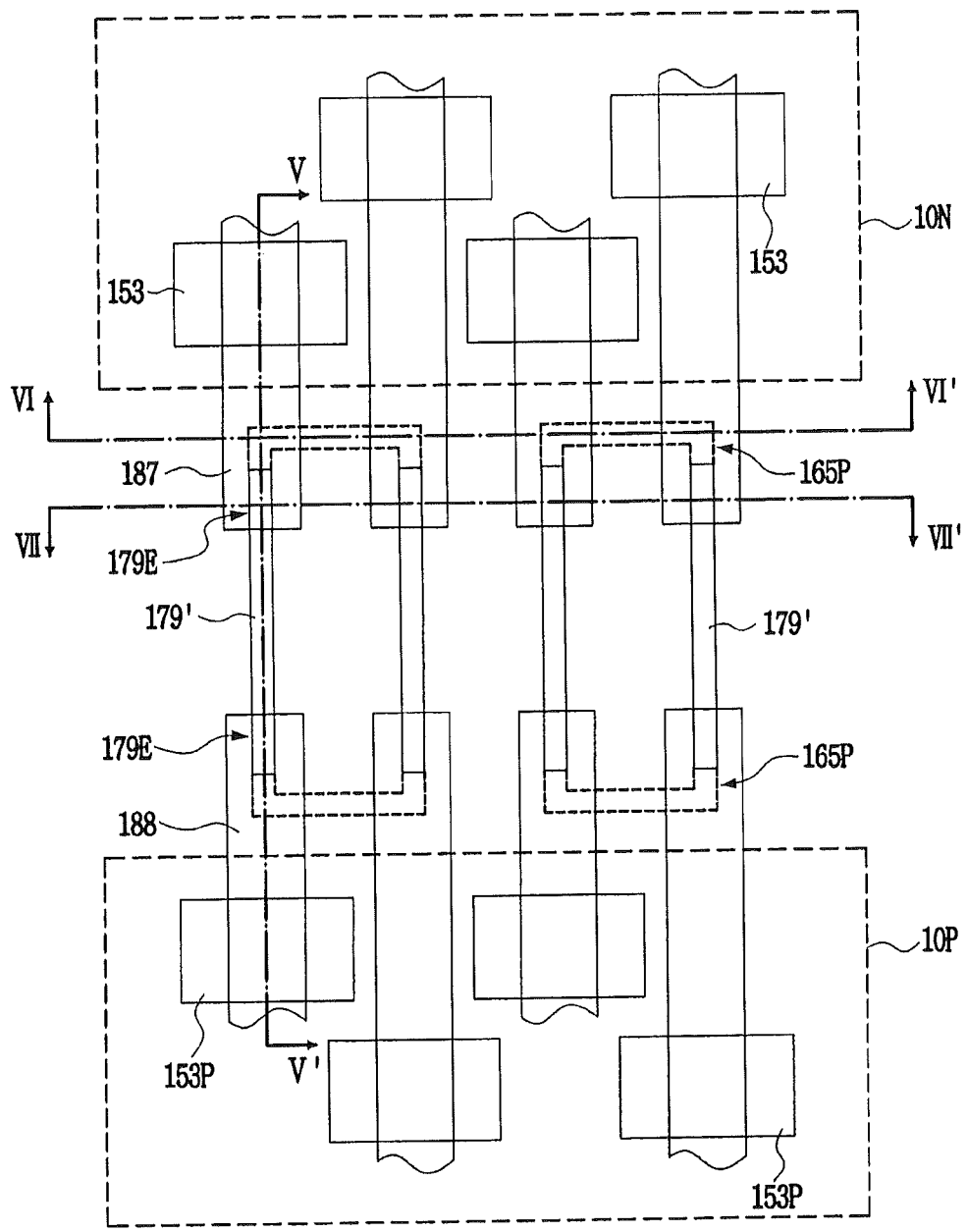
FIG. 15 is a plan view of a semiconductor device having buried interconnects according to second exemplary embodiments of the present invention.

A semiconductor device having buried interconnects and methods of fabrication therefor according to second exemplary embodiments of the present invention will now be described with reference to FIGS. 15 to 21. FIG. 15 is a plan view of a semiconductor device having buried interconnects according to the second exemplary embodiments of the present invention. FIGS. 16 to 21 are composites of cross-sectional views illustrating operations for fabricating the semiconductor device of FIG. 15, in which a cross-section 5 is taken along line V-V' of FIG. 15, a cross-section 6 is taken along line VI-VI' of FIG. 15, and a cross-section 7 is taken along line VII-VII' of FIG. 15.

Figure 16:
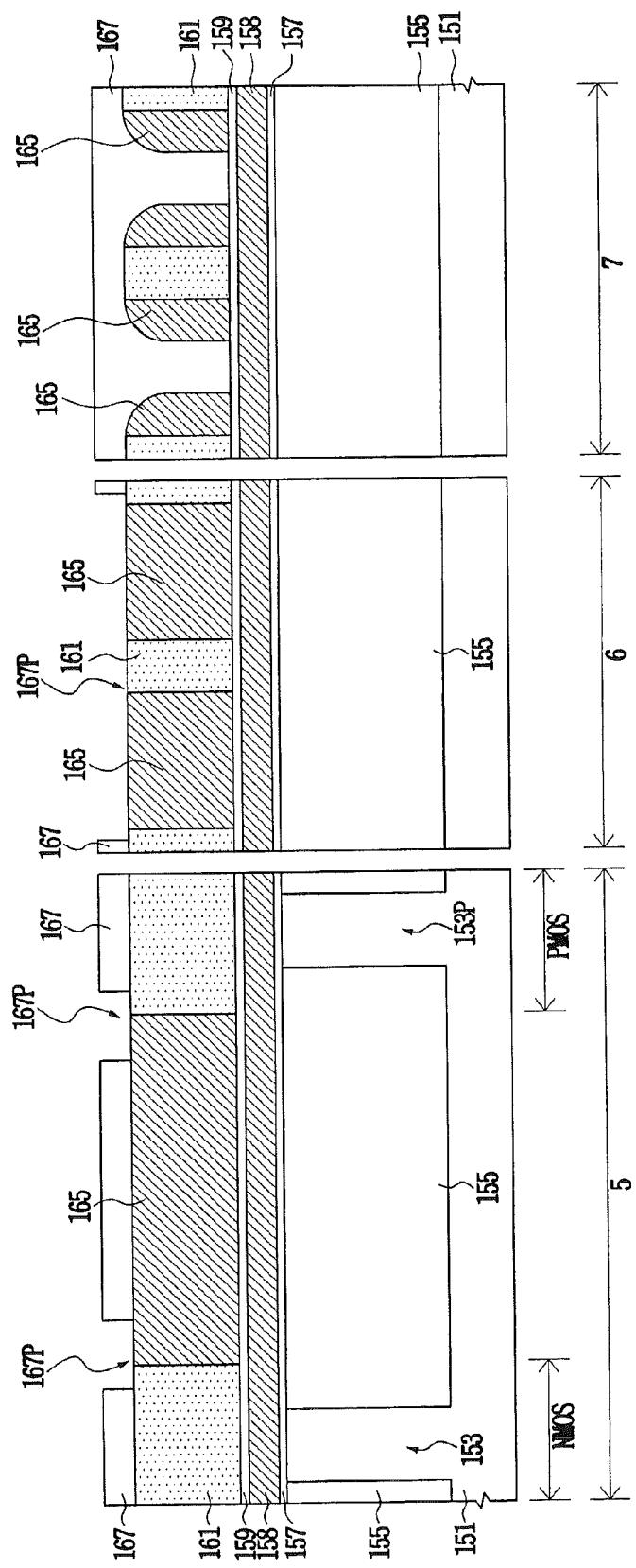
FIGS. 16 to 21 are composites of cross-sectional views illustrating operations for forming the semiconductor device of FIG. 15.

Referring to FIGS. 15 and 16, an isolation layer 155 defining active regions 153 and 153P in a peripheral circuit region may be formed in a semiconductor substrate 151. The semiconductor substrate 151 may be a silicon wafer having an nMOS region 10N and a pMOS region 10P. The active regions 153 and 153P may include nMOS peripheral circuit active regions 153 and pMOS peripheral circuit active regions 153P. The nMOS peripheral circuit active regions 153 may be arranged in the nMOS region 10N, and the pMOS peripheral circuit active regions 153P may be arranged in the pMOS region 10P.

A peripheral circuit gate dielectric layer 157 may be formed on the active regions 153 and 153P. A peripheral circuit gate conductive layer 158 and a sacrificial oxide layer 159 may be sequentially stacked on the semiconductor substrate 151 having the peripheral circuit gate dielectric layer 157.

A first sacrificial mask pattern 161 may be formed on the peripheral circuit gate conductive layer 158. The first sacrificial mask pattern 161 may be formed of a material layer having an etch selectivity with respect to the peripheral circuit gate conductive layer 158, the active regions 153 and 153P, and the isolation layer 155. A sacrificial spacer 165 may be formed on sidewalls of the first sacrificial mask pattern 161. The sacrificial spacer 165 may be formed of a material layer having an etch selectivity with respect to the first sacrificial mask pattern 161. The sacrificial spacer 165 may be formed of a polysilicon layer. The sacrificial spacer 165 may be formed to have a smaller thickness than the resolution limit of a photolithography process.

Subsequently, a patterning process for separating the sacrificial spacer 165 may be performed. Specifically, a photoresist pattern 167 may be formed on the semiconductor substrate 151 having the sacrificial spacer 165. The photoresist pattern 167 may have a first opening 167P partially exposing the sacrificial spacer 165.

Figure 17:
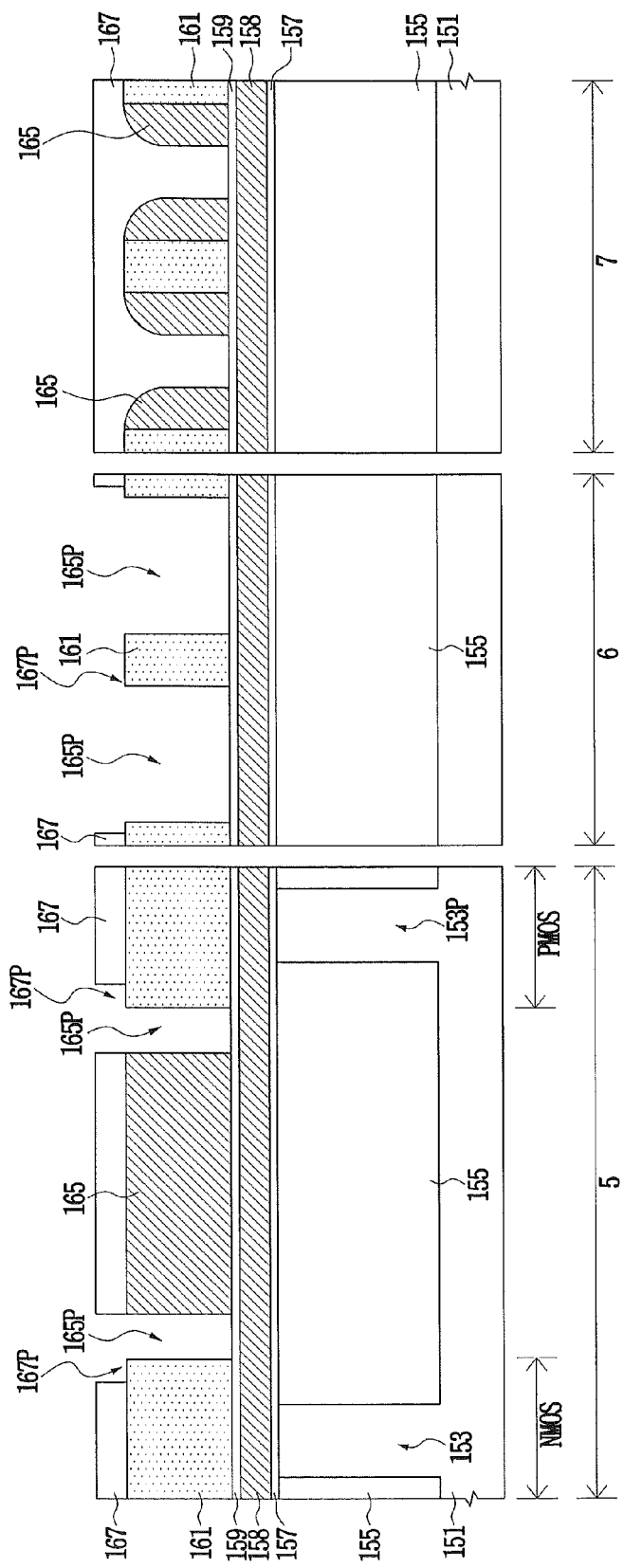

Referring to FIGS. 15 and 17, the sacrificial spacer 165 is etched using the photoresist pattern 167 as an etching mask, so that a second opening 165P exposing the sacrificial oxide layer 159 may be formed. The second opening 165P may be selectively formed at both ends of the sacrificial spacer 165. Subsequently, the photoresist pattern 167 may be removed.

Figure 18:
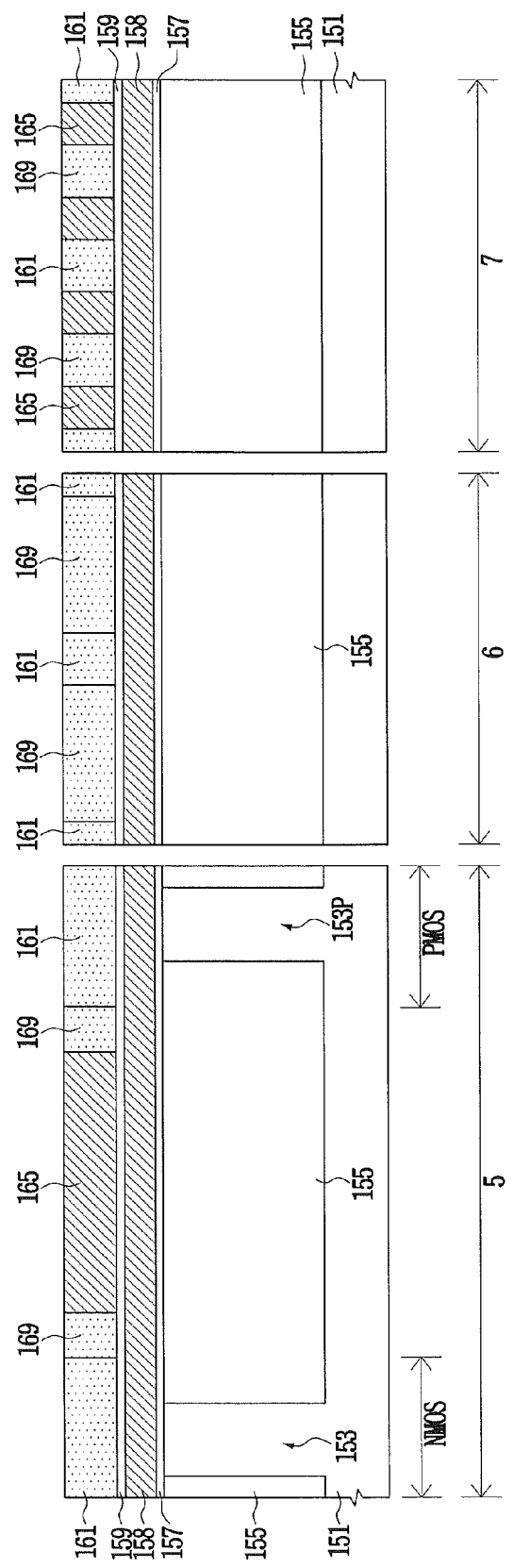

Referring to FIGS. 15 and 18, a second sacrificial mask pattern 169 filling a gap between the sacrificial spacers 165 and the second opening 165P may be formed.

Figure 19:
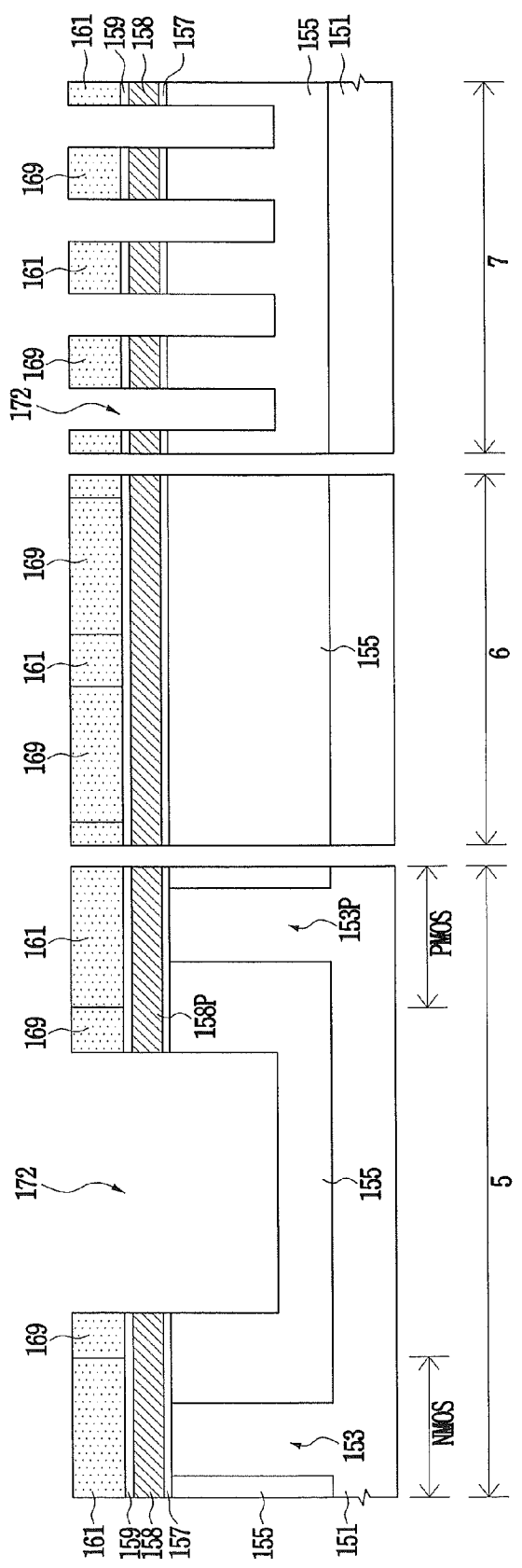

Referring to FIGS. 15 and 19, the sacrificial spacer 165 may be removed. An isotropic etching having an etch selectivity between the sacrificial mask patterns 161 and 169 and the sacrificial spacer 165 may be used for removal of the sacrificial spacer 165. Consequently, the sacrificial mask patterns 161 and 169 may remain on the semiconductor substrate 151.

The sacrificial oxide layer 159, the peripheral circuit gate conductive layer 158, the peripheral circuit gate dielectric layer 157, and the isolation layer 155 are anisotropically etched using the sacrificial mask patterns 161 and 169 as etching masks, so that interconnect trenches 172 may be formed.

The size of the interconnect trenches 172 may be determined by the sacrificial spacer 165. When the sacrificial spacer 165 has a smaller width than the resolution limit of a photolithography process, the interconnect trenches 172 may also be formed to have a smaller width than the resolution limit of a photolithography process.

Figure 20:
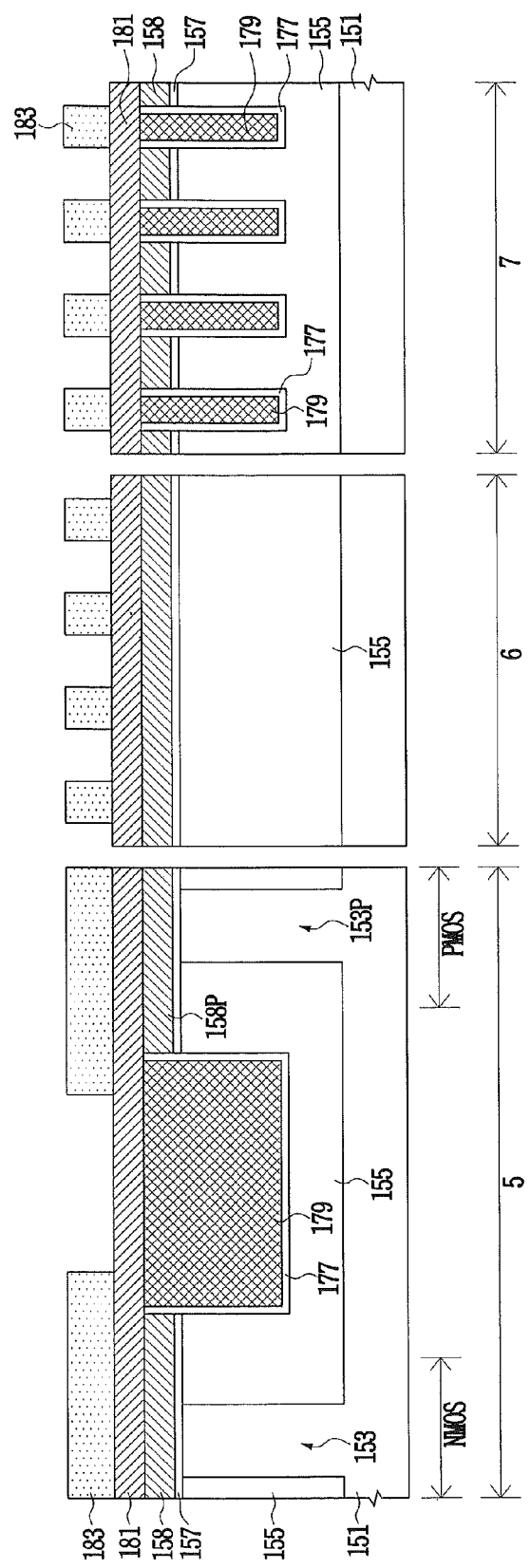

Referring to FIGS. 15 and 20, the sacrificial mask patterns 161 and 169 may be removed. A cell gate dielectric layer 177 may be formed on an inner wall of the interconnect trenches 172. Subsequently, interconnect patterns 179 are formed in the interconnect trenches 172. The sacrificial oxide layer 159 is removed, so that the peripheral circuit gate conductive layer 158 may be exposed.

The peripheral circuit gate conductive layer 158 and the interconnect patterns 179 may be exposed on substantially the same plane. In addition, the interconnect patterns 179 may be formed at a lower level than the top surface of the peripheral circuit gate conductive layer 158.

Alternatively, the sacrificial mask patterns 161 and 169 may be removed after the cell gate dielectric layer 177 and the interconnect patterns 179 are formed.

Subsequently, impurity ions may be implanted into the peripheral circuit gate conductive layer 158. For example, n-type impurity ions may be implanted into the peripheral circuit gate conductive layer 158 in the nMOS region, and p-type impurity ions may be implanted into a peripheral circuit gate conductive layer 158P in the pMOS region.

An upper conductive layer 181 covering the peripheral circuit gate conductive layers 158 and 158P and the interconnect patterns 179 may be formed. A hard mask pattern 183 may be formed on the upper conductive layer 181.

Figure 21:
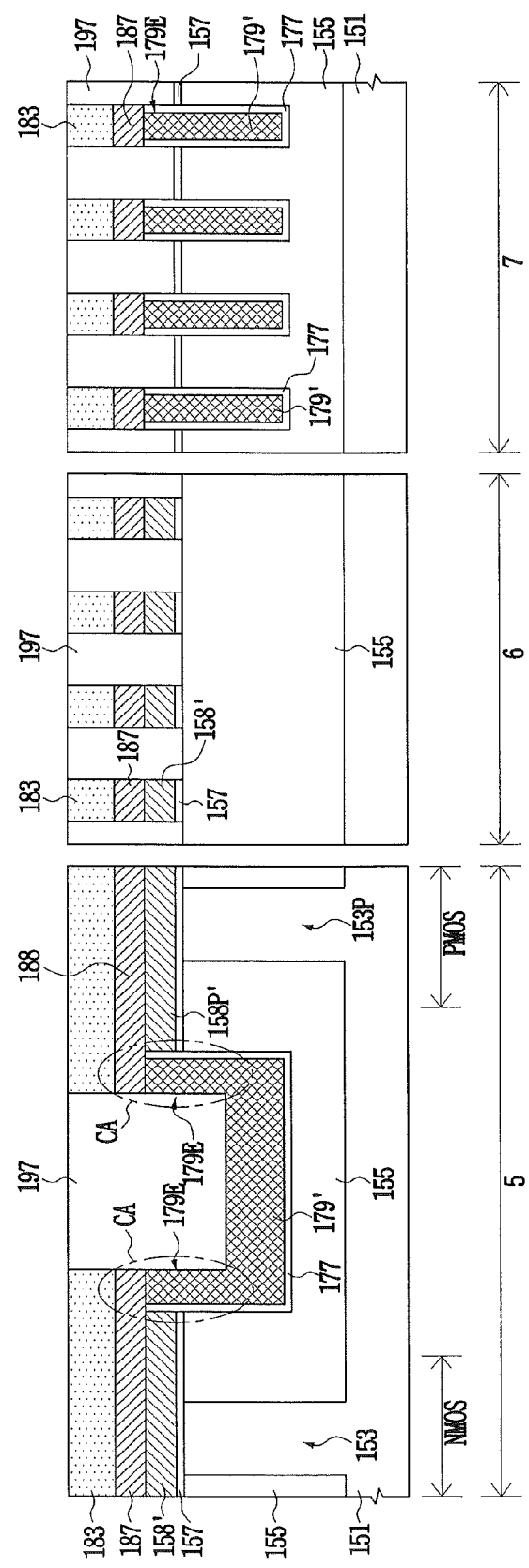

Referring to FIGS. 15 and 21, the upper conductive layer 181 and the peripheral circuit gate conductive layers 158 and 158P are etched using the hard mask pattern 183 as an etching mask, so that gate lines 187 and 188 may be formed. The gate lines 187 and 188 may include first gate lines 187 and second gate lines 188. The first gate lines 187 may be arranged in the nMOS region 10N, and the second gate lines 188 may be arranged in the pMOS region 10P.

Patterned peripheral circuit gate conductive layers 158' and 158P' may remain under the gate lines 187 and 188. In addition, the gate lines 187 and 188 may have regions CA overlapping the interconnect patterns 179.

As a result, parts of the interconnect patterns 179 except for the overlapping regions CA may be exposed. The exposed interconnect patterns 179 are etched back, so that buried interconnects 179' may be formed. The buried interconnects 179' may be formed at a lower level than the top surfaces of the adjacent active regions 153 and 153P.

In the overlapping regions CA, the interconnect patterns 179 may be conserved under the gate lines 187 and 188. In this case, the buried interconnects 179' may have projections 179E projecting upward. In other words, the buried interconnects 179' may project toward the gate lines 187 and 188 in the overlapping regions CA. Thus, the buried interconnects 179' may contact the gate lines 187 and 188.

The first gate lines 187 may be formed to cross over the nMOS peripheral circuit active regions 153. The peripheral circuit gate dielectric layer 157 and the patterned peripheral circuit gate conductive layers 158' sequentially stacked between the nMOS peripheral circuit active regions 153 and the first gate lines 187 may be conserved.

The second gate lines 188 may be formed to cross over the pMOS peripheral circuit active regions 153P. The peripheral circuit gate dielectric layer 157 and the patterned peripheral circuit gate conductive layers 158P' sequentially stacked between the pMOS peripheral circuit active regions 153P and the second gate lines 188 may be conserved.

The buried interconnects 179' may be formed between the first gate lines 187 and the second gate lines 188. In this case, one end of the buried interconnects 179' may overlap the first gate lines 187, and the other end thereof may overlap the second gate lines 188. The ends of the buried interconnects 179' may project toward the first and second gate lines 187 and 188, respectively.

An insulating pattern 197 may be formed on the buried interconnects 179'. The insulating pattern 197 may be formed of a silicon oxide layer, a silicon nitride layer, a silicon oxynitride layer, or a combination thereof. Consequently, the semiconductor substrate 151 may be covered by the hard mask pattern 183 and the insulating pattern 197.

As described above, the first gate lines 187 may be disposed in the nMOS region 10N, and the second gate lines 188 may be disposed in the pMOS region 10P. The first gate lines 187 may be electrically connected with the second gate lines 188 by the buried interconnects 179'.

Figure 22:
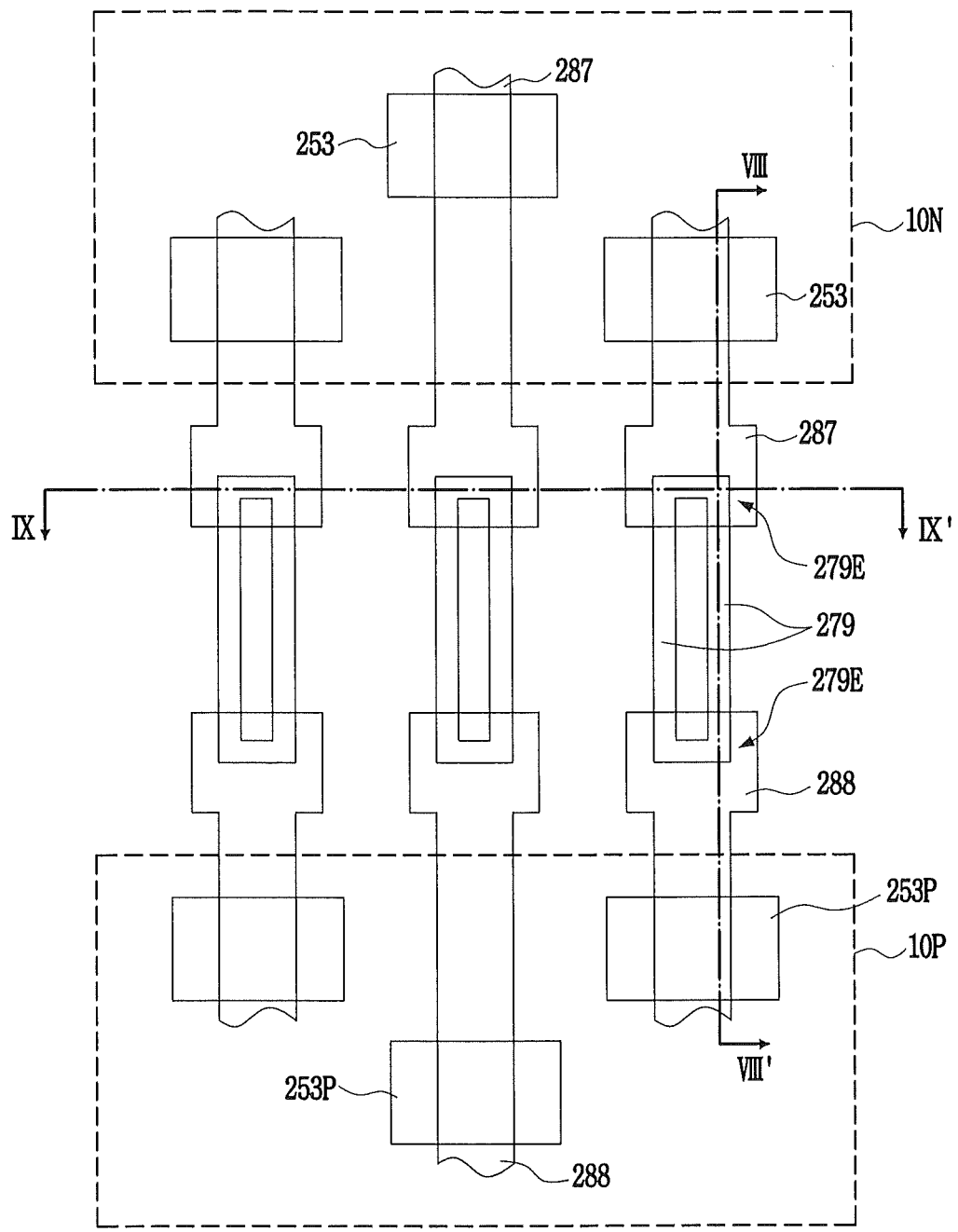
FIG. 22 is a plan view of a semiconductor device having buried interconnects according to third exemplary embodiments of the present invention.
Figure 23:
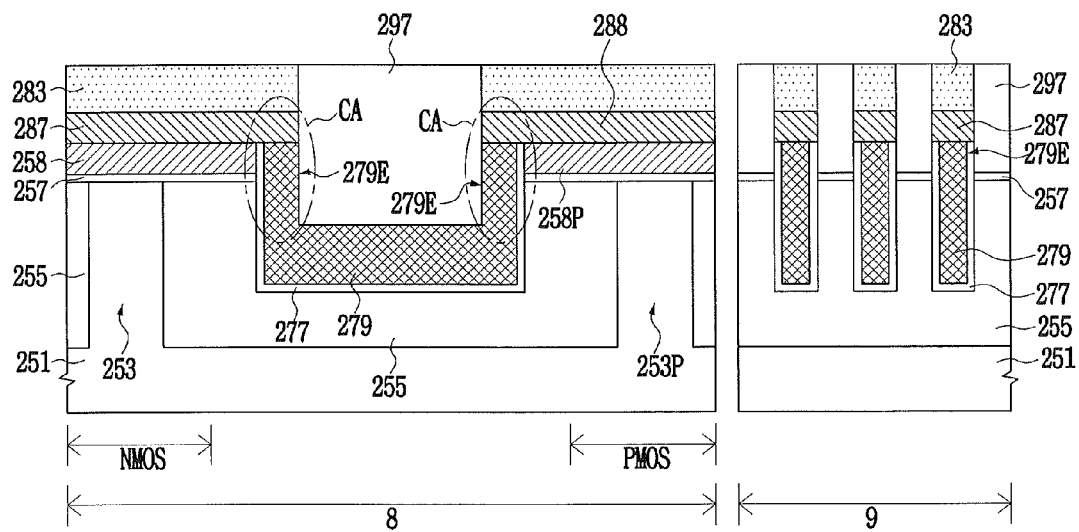
FIG. 23 is a composite of cross-sectional views illustrating operations for forming the semiconductor device of FIG. 23.

Now, a semiconductor device having buried interconnects and method of fabricating the same according to third exemplary embodiments of the present invention will be described with reference to FIGS. 22 and 23. FIG. 22 is a plan view of a semiconductor device having buried interconnects according to the third exemplary embodiments of the present invention. FIG. 23 is a composite of cross-sectional views illustrating operations for fabricating the semiconductor device of FIG. 22, in which a cross-section 8 is taken along line VIII-VIII' of FIG. 22, and a cross-section 9 is taken along line IX-IX' of FIG. 22.

Referring to FIGS. 22 and 23, the patterning process for separating the sacrificial spacer (165 of FIG. 17) as described with reference to FIGS. 16 and 17 is omitted in the method of fabricating a semiconductor device according to the third exemplary embodiments of the present invention. More specifically, the second opening (165P of FIG. 17) formed at both ends of the sacrificial spacer (165 of FIG. 17) is not formed.

Consequently, a semiconductor substrate according to the third exemplary embodiments of the present invention may have an isolation layer 255 disposed on a semiconductor substrate 251. The semiconductor substrate 251 may be a silicon wafer having an nMOS region 10N and a pMOS region 10P. By the isolation layer 255, nMOS peripheral circuit active regions 253 may be defined in the nMOS region 10N, and pMOS peripheral circuit active regions 253P may be defined in the pMOS region 10P.

Buried interconnects 279 may be disposed in interconnect trenches formed in the isolation layer 255. The buried interconnects 279 may be disposed at a lower level than the top surface of the peripheral circuit active regions 253 and 253P.

The bottom and sidewalls of the buried interconnects 279 may be surrounded by a cell gate dielectric layer 277. Gate lines 287 and 288 may be disposed at a higher level than the buried interconnects 279. A hard mask pattern 283 may be provided on the gate lines 287 and 288. The gate lines 287 and 288 may include first gate lines 287 and second gate lines 288. The gate lines 287 and 288 may be disposed at a higher level than the peripheral circuit active regions 253 and 253P.

The gate lines 287 and 288 may have regions CA overlapping the buried interconnects 279. In the overlapping regions CA, the buried interconnects 279 may contact the gate lines 287 and 288. The buried interconnects 279 may project toward the gate lines 287 and 288 in the overlapping regions CA. In other words, the buried interconnects 279 may have projections 279E projecting upward.

The first gate lines 287 may be disposed to cross over the nMOS peripheral circuit active regions 253. The second gate lines 288 may be disposed to cross over the pMOS peripheral circuit active regions 253P. A pair of the buried interconnects 279 may be disposed between the first gate lines 287 and the second gate lines 288. In this case, one end of the buried interconnects 279 may overlap the first gate lines 287, and the other end thereof may overlap the second gate lines 288. In addition, one pair of the buried interconnects 279 parallel to each other may be in contact with each other in the overlapping regions CA.

A peripheral circuit gate dielectric layer 257 and patterned peripheral circuit gate conductive layers 258 may be sequentially stacked between the nMOS peripheral circuit active regions 253 and the first gate lines 287.

The peripheral circuit gate dielectric layer 257 and patterned peripheral circuit gate conductive layers 258P may be sequentially stacked between the pMOS peripheral circuit active regions 253P and the second gate lines 288. Also, the peripheral circuit gate dielectric layer 257 and the patterned peripheral circuit gate conductive layers 258 and 258P may be sequentially stacked between the isolation layer 255 and the gate lines 287 and 288.

An insulating pattern 297 may be disposed on the buried interconnects 279. The bottom surface of the insulating pattern 297 may be disposed at a lower level than the top surfaces of the adjacent active regions 253 and 253P. Consequently, the semiconductor substrate 251 may be covered by the hard mask pattern 283 and the insulating pattern 297.

As described above, the first gate lines 287 may be disposed in the nMOS region 10N, and the second gate lines 288 may be disposed in the pMOS region 10P. The first gate lines 287 may be electrically connected with the second gate lines 288 by one pair of the buried interconnects 279.

Figure 24:
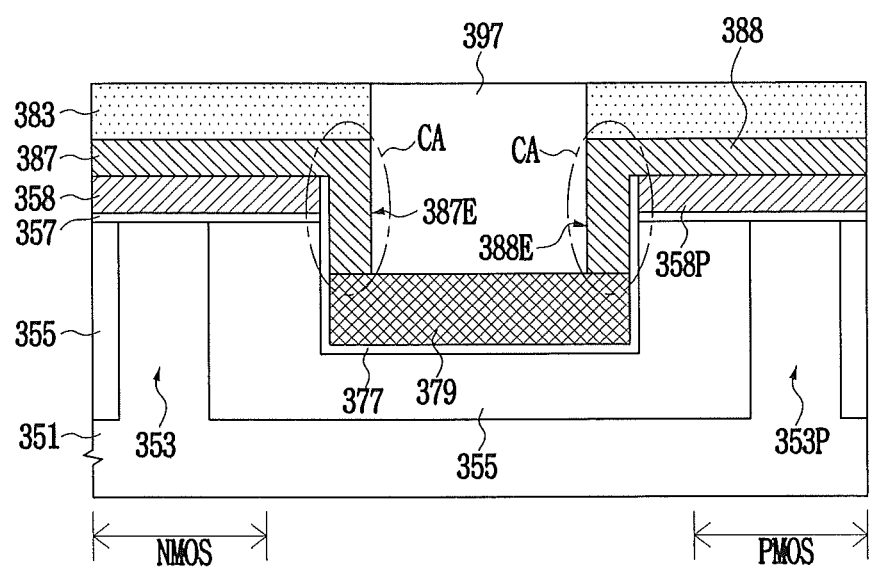
FIG. 24 is a plan view of a semiconductor device having buried interconnects according to fourth exemplary embodiments of the present invention.

Now, a semiconductor device having buried interconnects and methods of fabricating the same according to fourth exemplary embodiments of the present invention will be described with reference to FIG. 24. In the methods of fabricating a semiconductor device according to the fourth exemplary embodiments of the present invention, a buried interconnect 379 is formed, and then gate lines 387 and 388 are formed.

The semiconductor device according to the fourth exemplary embodiments of the present invention may have an isolation layer 355 disposed on a semiconductor substrate 351. The semiconductor substrate 351 may be a silicon wafer having an nMOS region and a pMOS region. By the isolation layer 355, an nMOS peripheral circuit active region 353 may be defined in the nMOS region, and a pMOS peripheral circuit active regions 353P may be defined in the pMOS region.

The buried interconnect 379 may be disposed in an interconnect trench formed in the isolation layer 355. The buried interconnect 379 may be disposed at a lower level than the top surfaces of the peripheral circuit active regions 353 and 353P.

The bottom and sidewalls of the buried interconnect 379 may be surrounded by a cell gate dielectric layer 377. The gate lines 387 and 388 may be disposed at a higher level than the buried interconnect 379. A hard mask pattern 383 may be provided on the gate lines 387 and 388. The gate lines 387 and 388 may include a first gate line 387 and a second gate line 388. The gate lines 387 and 388 may be disposed at a higher level than the peripheral circuit active regions 353 and 353P.

The gate lines 387 and 388 may have regions CA overlapping the buried interconnect 379. In the overlapping regions CA, the buried interconnect 379 may contact the gate lines 387 and 388. The gate lines 387 and 388 may project toward the buried interconnect 379 in the overlapping regions CA. In other words, projections 387E and 388E projecting downward may be provided to the gate lines 387 and 388.

The first gate line 387 may be disposed cross over the nMOS peripheral circuit active regions 353, and the second gate line 388 may be disposed cross over the pMOS peripheral circuit active regions 353P. The buried interconnect 379 may be disposed between the first gate line 387 and the second gate line 388. In this case, one end of the buried interconnect 379 may overlap the first gate line 387, and the other end thereof may overlap the second gate line 388.

A peripheral circuit gate dielectric layer 357 and patterned peripheral circuit gate conductive layers 358 may be sequentially stacked between the nMOS peripheral circuit active regions 353 and the first gate line 387. The peripheral circuit gate dielectric layer 357 and a patterned peripheral circuit gate conductive layer 358P may be sequentially stacked between the pMOS peripheral circuit active regions 353P and the second gate line 388. Also, the peripheral circuit gate dielectric layer 357 and the patterned peripheral circuit gate conductive layers 358 and 358P may be sequentially stacked between the isolation layer 355 and the gate lines 387 and 388.

An insulating pattern 397 may be disposed on the buried interconnect 379. The bottom surface of the insulating pattern 397 may be disposed at a lower level than the top surfaces of the adjacent active regions 353 and 353P. Consequently, the semiconductor substrate 351 may be covered by the hard mask pattern 383 and the insulating pattern 397.

As described above, according to some embodiments of the present invention, a buried word line is formed in a cell region while a buried interconnect is formed in a peripheral circuit region. The buried interconnect and the buried word line may be formed at a lower level than the top surface of an adjacent active region. Gate lines are disposed at a higher level than the buried interconnect. The gate lines have regions overlapping the buried interconnect. In the overlapping regions, the buried interconnect contacts the gate lines. An insulating pattern is provided on the buried interconnect and the buried word line. One of the gate lines may be electrically connected to the other gate line or the buried word line through the buried interconnect. Therefore, a signal transmission path can be shortened in comparison with a conventional interconnect method.

In addition, bit lines may be disposed on the insulating pattern. In this case, the buried interconnect is provided under the insulating pattern and thus does not disturb arrangement of the bit lines.

Consequently, it is possible to provide a semiconductor device having excellent electrical characteristics and advantageous to high integration.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. The invention is defined by the following claims.

What is claimed is:

1. A method of fabricating a semiconductor device, comprising:
    forming an isolation region in a semiconductor substrate, the isolation region defining cell active regions in a cell region and peripheral circuit active regions in a peripheral circuit region;
    forming a word line trench in the substrate in the cell region and an adjoining word line interconnect trench in the peripheral circuit region;
    forming a word line pattern in the word line trench and a word line interconnect pattern in the word line interconnect trench;
    forming a gate line on the substrate in the peripheral circuit region;
    simultaneously etching back the word line pattern and the word line interconnect pattern to form a word line extending longitudinally along a first direction in the word line trench and having a top surface lower than top surfaces of the cell active regions and a word line interconnect extending longitudinally beyond an end of the word line along the first direction in the word line interconnect trench and having a first portion connected to the word line and a top surface lower than the top surfaces of the cell active regions and a second portion extending vertically from the first portion to contact a bottom surface of the gate line overlying the first portion of the word line interconnect pattern; and
    forming an insulating pattern on the word line and the first portion of the word line interconnect.

2. The method of claim 1, wherein forming a word line trench in the cell region and an adjoining word line interconnect trench in the peripheral circuit region comprises:
    forming a first sacrificial mask pattern on the substrate having the isolation layer region;
    forming sacrificial spacers on sidewalls of the first sacrificial mask pattern;
    forming a second sacrificial mask pattern filling a gap between the sacrificial spacers;
    removing the sacrificial spacers; and
    etching the isolation region and the semiconductor substrate using the first and second sacrificial mask patterns as etching masks to form the word line trench and the word line interconnect trench.

3. The method of claim 2, wherein forming the first sacrificial mask pattern on the substrate having the isolation region is preceded by:
    forming a peripheral circuit gate dielectric layer on the peripheral circuit active regions;
    forming a peripheral circuit gate conductive layer on the peripheral circuit gate dielectric layer; and
    forming a sacrificial oxide layer on the peripheral circuit gate conductive layer.

4. The method of claim 3, wherein forming the gate line comprises:
    etching the first and second sacrificial mask patterns and the sacrificial oxide layer to expose the peripheral circuit gate conductive layer;
    forming a metal layer covering the peripheral circuit gate conductive layer, the word line pattern, and the word line interconnect pattern; and
    patterning the metal layer and the peripheral circuit gate conductive layer to form the gate line.

5. The method of claim 1, wherein the word line pattern and the word line interconnect pattern are formed from a common metal-containing layer.

6. The method of claim 1, wherein a bottom surface of the insulating pattern is lower than top surfaces of the cell active regions.

7. The method of claim 1, further comprising forming a bit line on the insulating pattern and crossing the buried word line.

8. The method of claim 7, wherein the gate line is a first gate line and wherein the method further comprises:
    forming a peripheral circuit interconnect trench in the substrate in the peripheral circuit region concurrent with forming the word line trench in the substrate in the cell region and the adjoining word line interconnect trench in the peripheral circuit region;
    forming a peripheral circuit interconnect pattern in the peripheral circuit interconnect trench concurrent with forming the word line pattern in the word line trench and the word line interconnect pattern in the word line interconnect trench;
    forming second and third spaced apart gate lines in the peripheral circuit region on respective sides of a location at which the bit line is to be formed concurrent with forming the first gate line on the substrate in the peripheral circuit region, the first and second gate lines overlapping and contacting the peripheral circuit interconnect pattern;
    etching back the peripheral circuit interconnect pattern concurrent with etching back the word line pattern and the word line interconnect pattern to form a peripheral circuit interconnect having a first portion with a top surface that is lower than a top surface of the peripheral circuit active regions and second portions that extend vertically from the first portion to contact bottom surfaces of respective ones of the second and third gate lines; and
    forming an insulating pattern on the first portion of the peripheral circuit interconnect concurrent with forming the insulating pattern on the buried word line and the first portion of the word line interconnect.

9. The method of claim 1, wherein the buried word line extends along a line across the cell region, and wherein the first portion of the word line interconnect is laterally offset with respect to the line.

10. A method of fabricating a semiconductor device, comprising:
    providing a semiconductor substrate having a cell region and a peripheral circuit region;
    forming an isolation layer defining cell active regions in the cell region and peripheral circuit active regions in the peripheral circuit region;

etching the cell active regions and the isolation layer, and simultaneously forming word line trenches in the cell region and interconnect trenches in the peripheral circuit region;

simultaneously forming word line patterns extending longitudinally along a first direction in the word line trenches and interconnect patterns extending longitudinally beyond ends of the word line patterns along the first direction in the interconnect trenches;

forming gate lines on the semiconductor substrate having the interconnect patterns, the gate lines having regions overlapping the interconnect patterns;

etching-back the word line patterns and the interconnect patterns to form word lines and interconnects, the interconnects having first portions at a same level as the word lines and second portions that extend vertically from the first portions to contact bottom surfaces of the gate lines overlying the first portions of the interconnects; and forming an insulating pattern on the word lines and the buried interconnects.

11. The method of claim 10, wherein forming the word line trenches and the interconnect trenches comprises:

forming a first sacrificial mask pattern on the substrate having the isolation layer;

forming sacrificial spacers on sidewalls of the first sacrificial mask pattern;

forming a second sacrificial mask pattern filling a gap between the sacrificial spacers;

removing the sacrificial spacers; and etching the isolation layer and the cell active layers using the first and second sacrificial mask patterns as etching masks.

12. The method of claim 11, wherein the first and second sacrificial mask patterns have an etch selectivity with respect to the active regions and the isolation layer.

13. The method of claim 11, wherein the sacrificial spacers are formed of a polysilicon layer.

14. The method of claim 11, wherein the word line trenches and the interconnect trenches are formed to have a smaller width than a resolution limit of a photolithography process.

15. The method of claim 11, before forming the first sacrificial mask pattern, further comprising:

forming a peripheral circuit gate dielectric layer on the peripheral circuit active regions;

forming a peripheral circuit gate conductive layer on the semiconductor substrate having the peripheral circuit gate dielectric layer; and forming a sacrificial oxide layer on the peripheral circuit gate conductive layer.

16. The method of claim 15, wherein forming the gate lines comprises:

while the word line patterns and the interconnect patterns are formed, etching the sacrificial mask patterns and the sacrificial oxide layer and exposing the peripheral circuit gate conductive layer;

forming a metal layer covering the peripheral circuit gate conductive layer, the word line patterns, and the interconnect patterns; and continuously patterning the metal layer and the peripheral circuit gate conductive layer.

17. The method of claim 10, wherein the word line patterns and the interconnect patterns are formed of a metal-containing layer.

18. The method of claim 10, wherein the word line trenches are formed to be connected to the interconnect trenches corresponding thereto, respectively.

19. The method of claim 10, wherein a bottom surface of the insulating pattern is formed at a lower level than top surfaces of the adjacent active regions.

20. A method of fabricating a semiconductor device, comprising:

providing a semiconductor substrate having a cell region and a peripheral circuit region;

forming an isolation layer defining cell active regions in the cell region and peripheral circuit active regions in the peripheral circuit region;

etching the cell active regions and the isolation layer, and simultaneously forming word line trenches in the cell region and interconnect trenches in the peripheral circuit region;

simultaneously forming buried word lines in the word line trenches and buried interconnects in the interconnect trenches, the buried interconnects in contact with ends of respective ones of the buried word lines and extending longitudinally beyond ends thereof;

forming gate lines on the semiconductor substrate having the buried interconnects, the gate lines having regions overlapping the buried interconnects, the buried interconnects contacting bottom surfaces of the overlapping regions; and forming an insulating pattern on the buried word lines and the buried interconnects disposed at a lower level than top surfaces of the adjacent active regions.

* * * * *